United States Patent
Tran et al.

(10) Patent No.: US 11,847,556 B2
(45) Date of Patent: Dec. 19, 2023

(54) PRECISE DATA TUNING METHOD AND APPARATUS FOR ANALOG NEURAL MEMORY IN AN ARTIFICIAL NEURAL NETWORK

(71) Applicant: Silicon Storage Technology, Inc., San Jose, CA (US)

(72) Inventors: Hieu Van Tran, San Jose, CA (US); Steven Lemke, Boulder Creek, CA (US); Vipin Tiwari, Dublin, CA (US); Nhan Do, Saratoga, CA (US); Mark Reiten, Alamo, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/875,281

(22) Filed: Jul. 27, 2022

(65) Prior Publication Data

US 2022/0374699 A1    Nov. 24, 2022

Related U.S. Application Data

(62) Division of application No. 16/829,757, filed on Mar. 25, 2020, now Pat. No. 11,636,322.

(Continued)

(51) Int. Cl.
*G06N 3/065* (2023.01)
*G11C 11/54* (2006.01)
(Continued)

(52) U.S. Cl.
CPC .............. *G06N 3/065* (2023.01); *G06F 1/03* (2013.01); *G06F 7/78* (2013.01); *G06F 11/1666* (2013.01);
(Continued)

(58) Field of Classification Search
CPC ........ G06N 3/065; G06N 3/044; G06N 3/045; G06N 3/048; G06F 1/03; G06F 7/78;
(Continued)

(56) References Cited

U.S. PATENT DOCUMENTS

| | | |
|---|---|---|
| 5,029,130 A | 7/1991 | Yeh |
| 6,747,310 B2 | 6/2004 | Fan et al. |

(Continued)

FOREIGN PATENT DOCUMENTS

| | | |
|---|---|---|
| CN | 209657299 U | 11/2019 |
| CN | 110782026 | 2/2020 |

(Continued)

OTHER PUBLICATIONS

PCT Search Report and Written Opinion dated Feb. 2, 2022 corresponding to the related PCT Patent Application No. US2021/033122.

(Continued)

*Primary Examiner* — Tan V Mai
(74) *Attorney, Agent, or Firm* — DLA PIPER LLP US

(57) ABSTRACT

Numerous examples of a precision programming apparatus are disclosed for precisely and quickly depositing the correct amount of charge on the floating gate of a non-volatile memory cell within a vector-by-matrix multiplication (VMM) array in an artificial neural network. In one example, a neuron output circuit for providing a current to program as a weight value in a selected memory cell in a vector-by-matrix multiplication array is disclosed, the neuron output circuit comprising a first adjustable current source to generate a scaled current in response to a neuron current to implement a positive weight, and a second adjustable current source to generate a scaled current in response to a neuron current to implement a negative weight.

6 Claims, 44 Drawing Sheets

Neuron Output Circuit
4300

Related U.S. Application Data

(60) Provisional application No. 62/957,013, filed on Jan. 3, 2020.

(51) Int. Cl.
| | | |
|---|---|---|
| *G06F 1/03* | (2006.01) | |
| *G06F 17/16* | (2006.01) | |
| *G11C 11/56* | (2006.01) | |
| *G06F 11/16* | (2006.01) | |
| *G11C 13/00* | (2006.01) | |
| *G11C 29/44* | (2006.01) | |
| *G06F 7/78* | (2006.01) | |

(52) U.S. Cl.
CPC ............. *G06F 17/16* (2013.01); *G11C 11/54* (2013.01); *G11C 11/5635* (2013.01); *G11C 13/0021* (2013.01); *G11C 29/44* (2013.01)

(58) Field of Classification Search
CPC . G06F 17/16; G11C 11/5628; G11C 16/3486; G11C 29/028; G11C 27/005; G11C 16/349; G11C 16/10; G11C 16/16; G11C 16/24; G11C 16/26; G11C 16/0425; G11C 16/3413; G11C 16/3459; G11C 16/3463
USPC .......................................................... 706/38
See application file for complete search history.

(56) References Cited

U.S. PATENT DOCUMENTS

| | | | | |
|---|---|---|---|---|
| 7,551,028 | B1 * | 6/2009 | Cyrusian | ................ H03F 3/217 330/10 |
| 2010/0327928 | A1 * | 12/2010 | Li | ........................ H03K 17/163 327/170 |
| 2017/0337466 | A1 | 11/2017 | Bayat et al. | |
| 2019/0164617 | A1 | 5/2019 | Tran et al. | |
| 2019/0341110 | A1 | 11/2019 | Tran et al. | |
| 2020/0364583 | A1 | 11/2020 | Pedersen | |
| 2021/0089875 | A1 | 3/2021 | Tran | |

FOREIGN PATENT DOCUMENTS

| | | |
|---|---|---|
| JP | H08-249893 A | 9/1996 |
| TW | 201802726 | 1/2018 |
| TW | 201939516 A | 10/2019 |

OTHER PUBLICATIONS

Mahmoodi M. Reza, et al., "An Ultra-Low Energy Internally Analog, Externally Digital Vector-Matrix Multiplier Based on NOR Flash Memory Technology," pp. 1-6, Jun. 24, 2018, IEEE.

Siming Ma, et al., "A binary-activation, multi-level weight RNN and training algorithm for ADC-/DAC-free and noise-resilient processing-in-memory inference with eNVM," pp. 2-8, Oct. 12, 2020, ARXIV. Org., Cornell University Library, Olin Libarary Cornell University Ithaca, NY.

Giordano Massimo et al., "Analog-to-Digital Conversion with Reconfigurable Function Mapping for Neural Networks Activitation Function Acceleration," pp. 367-376, Jun. 1, 2019, IEEE. (Abstract Only) (https://doi.org/10.1109/JETCAS.2019.2911537).

Taiwanese Office Action dated Dec. 28, 2021 corresponding to the counterpart Taiwanese Patent Application No. 109143997.

Bayat, et al., "Model-based high-precision tuning of NOR flash memory cells for analog computing applications," IEEE, Jun. 19, 2016, pp. 1-2.

Guo, "Mixed signal neurocomputing based on floating-gate memories," retrieved from the Internet: url:https://www.alexandria.ucsb.edu/lib/ark:/48907/f3jh3mb0, Oct. 2019, pp. 1-106, pp. 28-35.

U.S. Appl. No. 16/449,201, filed Jun. 21, 2019, Tran et al.

U.S. Appl. No. 16/751,202, filed Jan. 23, 2020, Tran et al., claiming priority to U.S. Appl. No. 62/933,809, filed Nov. 11, 2019, Tran et al.

Ma, Siming, et al., "A binary-activation, multi-level weight RNN and training algorithm for processing-in-memory inference with eNVM arXiv," pp. 1-8, Nov. 30, 2019.

Taiwanese Office Action dated Nov. 16, 2022 corresponding to the related Taiwanese Patent Application No. 111101921.

Japanese Notice of Reasons for Rejection dated Jul. 25, 2023 corresponding to the related Japanese Patent Application No. 2022-540417.

European Examiner's Report dated Jun. 13, 2023 corresponding to the related European Patent Application No. 20 746 800.0.

* cited by examiner

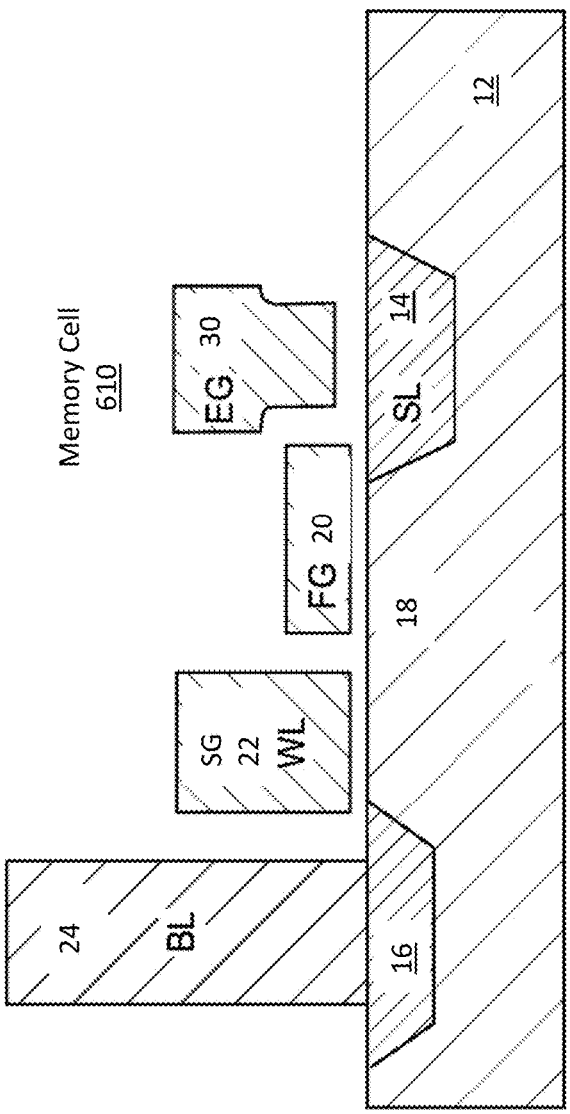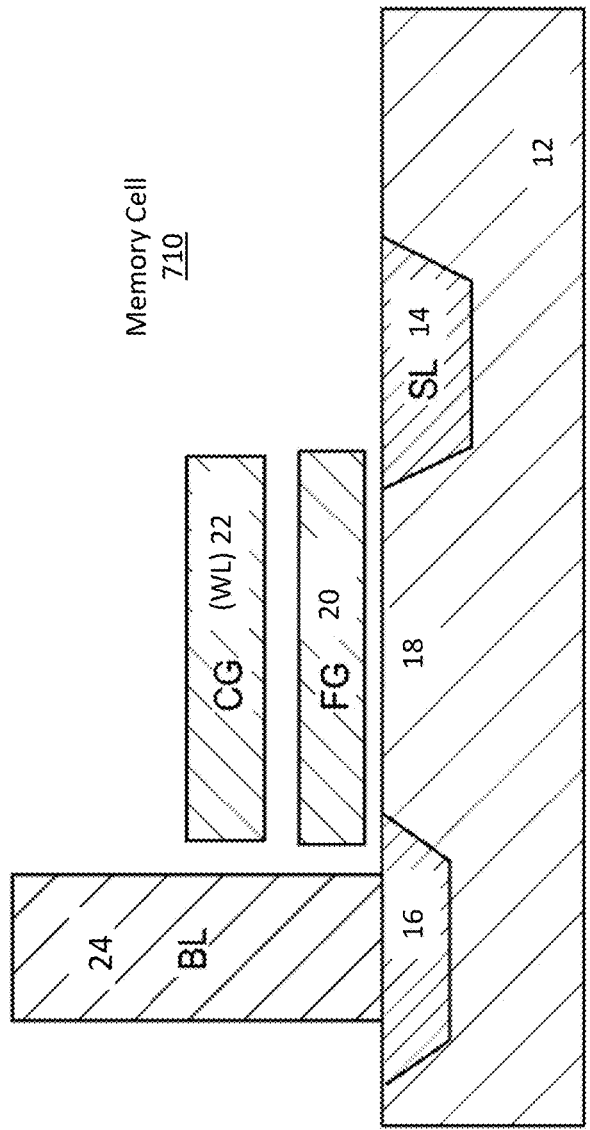
FIGURE 6
(PRIOR ART)
FIGURE 7
(PRIOR ART)

PRECISE DATA TUNING METHOD AND APPARATUS FOR ANALOG NEURAL MEMORY IN AN ARTIFICIAL NEURAL NETWORK

PRIORITY CLAIM

This application is a divisional of U.S. patent application Ser. No. 16/829,757, filed on Mar. 25, 2020, and titled, "Precise Data Tuning Method and Apparatus for Analog Neural Memory in an Artificial Neural Network," which claims priority to U.S. Provisional Patent Application No. 62/957,013, filed on Jan. 3, 2020, and titled "Precise Data Tuning Method and Apparatus for Analog Neuromorphic Memory in an Artificial Neural Network," which are incorporated by reference herein.

FIELD OF THE INVENTION

Numerous embodiments of a precision tuning method and apparatus are disclosed for precisely and quickly depositing the correct amount of charge on the floating gate of a non-volatile memory cell within a vector-by-matrix multiplication (VMM) array in an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Each non-volatile memory cell used in the VMM array must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256. One challenge is the ability to program selected cells with the precision and granularity required for different values of N. For example, if a selected cell can include one of 64 different values, extreme precision is required in program operations.

What is needed are improved programming systems and methods suitable for use with a VMM array in an analog neuromorphic memory.

SUMMARY OF THE INVENTION

Numerous embodiments of a precision tuning algorithm and apparatus are disclosed for precisely and quickly depositing the correct amount of charge on the floating gate of a non-volatile memory cell within a VMM array in an analog neuromorphic memory system. Selected cells thereby can be programmed with extreme precision to hold one of N different values.

In one embodiment, a method of tuning a selected non-volatile memory cell in a vector-by-matrix multiplication array of non-volatile memory cells is provided, the method comprising: (i) setting an initial current target for the selected non-volatile memory cell; (ii) performing a soft erase on all non-volatile memory cells in the vector-by-matrix multiplication array; (iii) performing a coarse programming operation on the selected memory cell; (iv) performing a fine programming operation on the selected memory cell; (v) performing a read operation on the selected memory cell and determining a current drawn by the selected memory cell during the read operation; (vi) calculating an output error based on a difference between the determined current and the initial current target; and repeating steps (i), (ii), (iii), (iv), (v), and (vi) until the output error is less than a predetermined threshold.

In another embodiment, a method of tuning a selected non-volatile memory cell in a vector-by-matrix multiplication array of non-volatile memory cells is provided, the method comprising: (i) setting an initial target for the selected non-volatile memory cell; (ii) performing a programming operation on the selected memory cell; (iii)

performing a read operation on the selected memory cell and determining a cell output drawn by the selected memory cell during the read operation; (iv) calculating an output error based on a difference between the determined output and the initial target; and (v) repeating steps (i), (ii), (iii), and (iv) until the output error is less than a predetermined threshold.

In another embodiment, a neuron output circuit for providing a current to program as a weight value in a selected memory cell in a vector-by-matrix multiplication array is provided, the neuron output circuit comprising: a first adjustable current source to generate a scaled current in response to a neuron current to implement a positive weight; and a second adjustable current source to generate a scaled current in response to a neuron current to implement a negative weight.

In another embodiment, a neuron output circuit for providing a current to program as a weight value in a selected memory cell in a vector-by-matrix multiplication array, the neuron output circuit comprising an adjustable capacitor comprising a first terminal and a second terminal, the second terminal providing an output voltage for the neuron output circuit; a control transistor comprising a first terminal and a second terminal; a first switch selectively coupled between the first terminal and the second terminal of the adjustable capacitor; a second switch selectively coupled between the second terminal of the adjustable capacitor and the first terminal of the control transistor; and an adjustable current source coupled to the second terminal of the control transistor.

In another embodiment, a neuron output circuit for providing a current to program as a weight value in a selected memory cell in a vector-by-matrix multiplication array is provided, the neuron output circuit comprising: an adjustable capacitor comprising a first terminal and a second terminal, the second terminal providing an output voltage for the neuron output circuit; a control transistor comprising a first terminal and a second terminal; a switch selectively coupled between the second terminal of the adjustable capacitor and the first terminal of the control transistor; and an adjustable current source coupled to the second terminal of the control transistor.

In another embodiment, a neuron output circuit for providing a current to program as a weight value in a selected memory cell in a vector-by-matrix multiplication array, the neuron output circuit comprising: an adjustable capacitor comprising a first terminal and a second terminal, the first terminal providing an output voltage for the neuron output circuit; a control transistor comprising a first terminal and a second terminal; a first switch selectively coupled between the first terminal of the adjustable capacitor and the first terminal of the control transistor; and an adjustable current source coupled to the second terminal of the control transistor.

In another embodiment, a neuron output circuit for providing a current to program as a weight value in a selected memory cell in a vector-by-matrix multiplication array, the neuron output circuit comprising: a first operational amplifier comprising an inverting input, a non-inverting input, and an output; a second operational amplifier comprising an inverting input, a non-inverting input, and an output; a first adjustable current source coupled to the inverting input of the first operational amplifier; a second adjustable current source coupled to the inverting input of the second operational amplifier; a first adjustable resistor coupled to the inverting input of the first operational amplifier; a second adjustable resistor coupled to the inverting input of the second operational amplifier; and a third adjustable resistor coupled between the output of the first operational amplifier and the inverting input of the second operational amplifier.

In another embodiment, a neuron output circuit for providing a current to program as a weight value in a selected memory cell in a vector-by-matrix multiplication array, the neuron output circuit comprising: a first operational amplifier comprising an inverting input, a non-inverting input, and an output; a second operational amplifier comprising an inverting input, a non-inverting input, and an output; a first adjustable current source coupled to the inverting input of the first operational amplifier; a second adjustable current source coupled to the inverting input of the second operational amplifier; a first switch coupled between the inverting input and the output of the first operational amplifier; a second switch coupled between the inverting input and the output of the second operational amplifier; a first adjustable capacitor coupled between the inverting input and the output of the first operational amplifier; a second adjustable capacitor coupled between the inverting input and the output of the second operational amplifier; and a third adjustable capacitor coupled between the output of the first operational amplifier and the inverting input of the second operational amplifier.

BRIEF DESCRIPTION OF THE DRAWINGS

FIG. 6 depicts another prior art split gate flash memory cell.

FIG. 7 depicts a prior art stacked gate flash memory cell.

DETAILED DESCRIPTION OF THE INVENTION

The artificial neural networks of the present invention utilize a combination of CMOS technology and non-volatile memory arrays.

Non-Volatile Memory Cells

Figure 1:
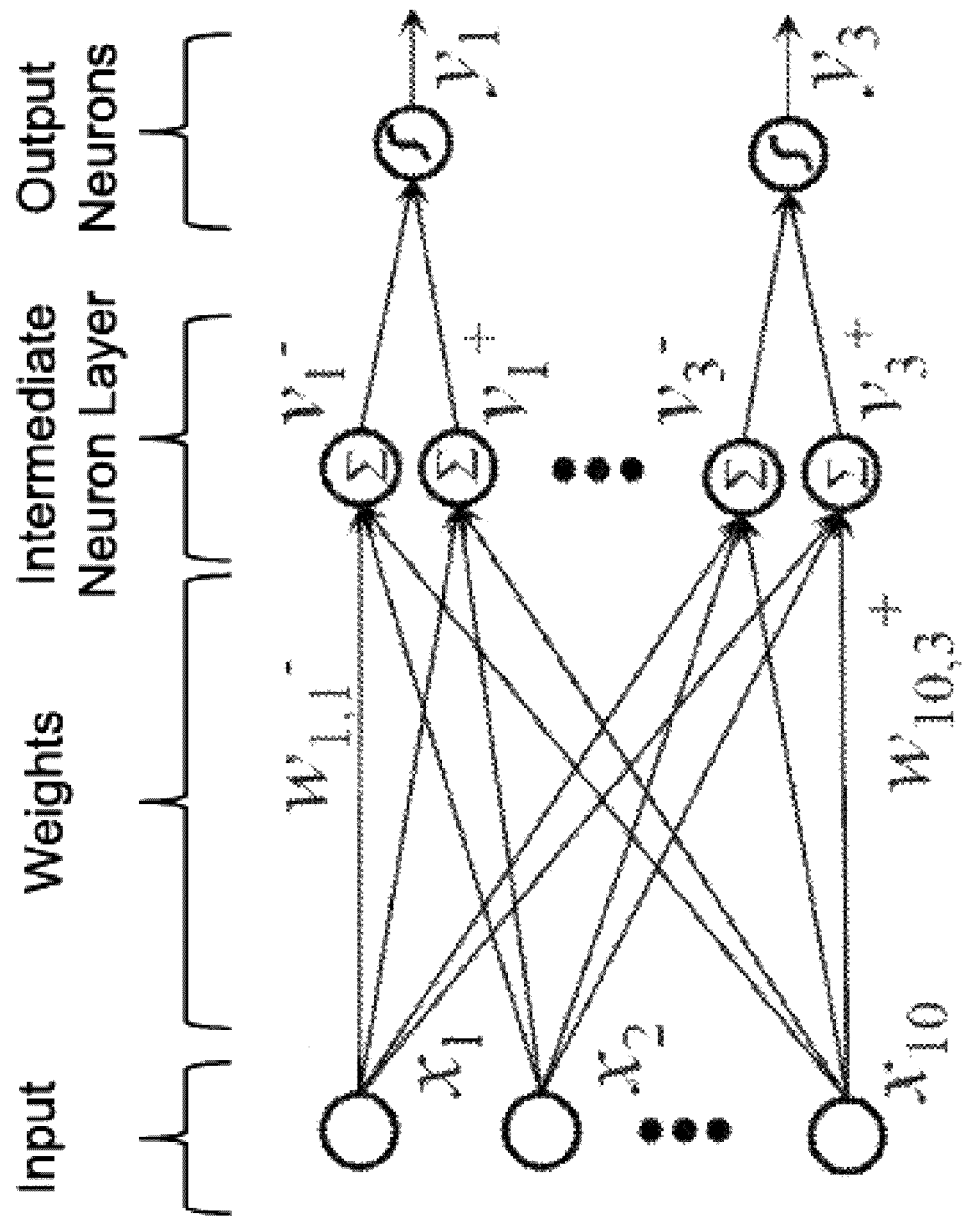
FIG. 1 is a diagram that illustrates a prior art artificial neural network.
Figure 2:
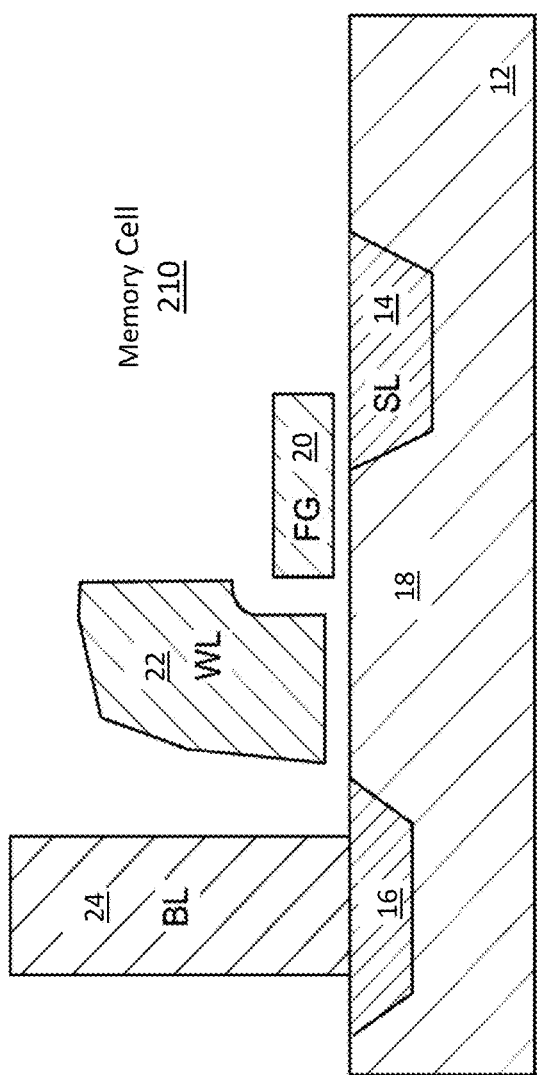
FIG. 2 depicts a prior art split gate flash memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 (source line terminal) towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
| --- | --- | --- | --- |
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line terminal.

Figure 3:
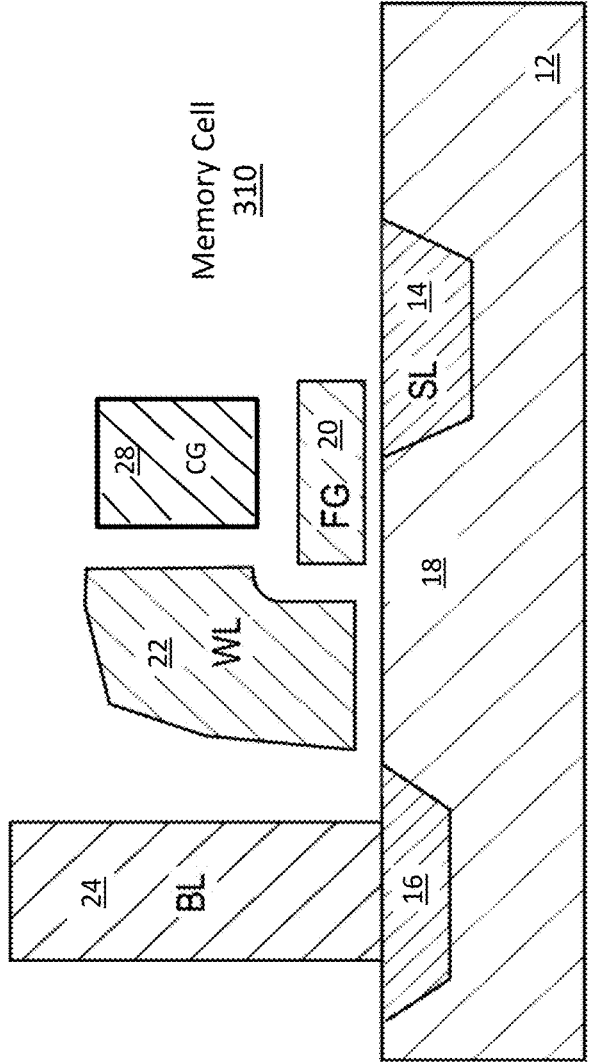
FIG. 3 depicts another prior art split gate flash memory cell

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

Figure 4:
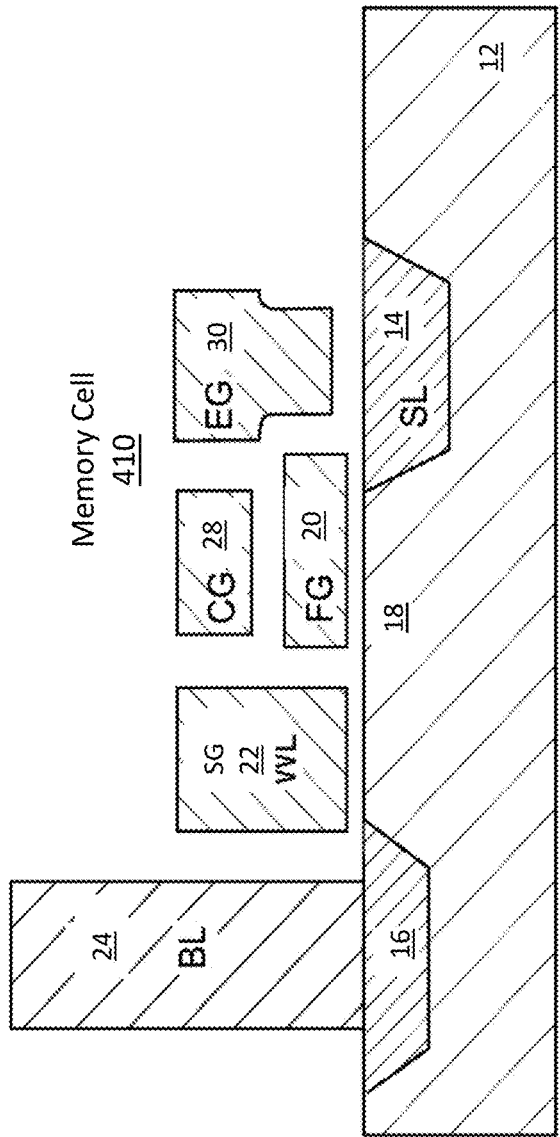
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 μA | 8-11 V | 4.5-9 V | 4.5-5 V |

"Read 1" is a read mode in which the cell current is output on the bit line. "Read 2" is a read mode in which the cell current is output on the source line terminal.

Figure 5:
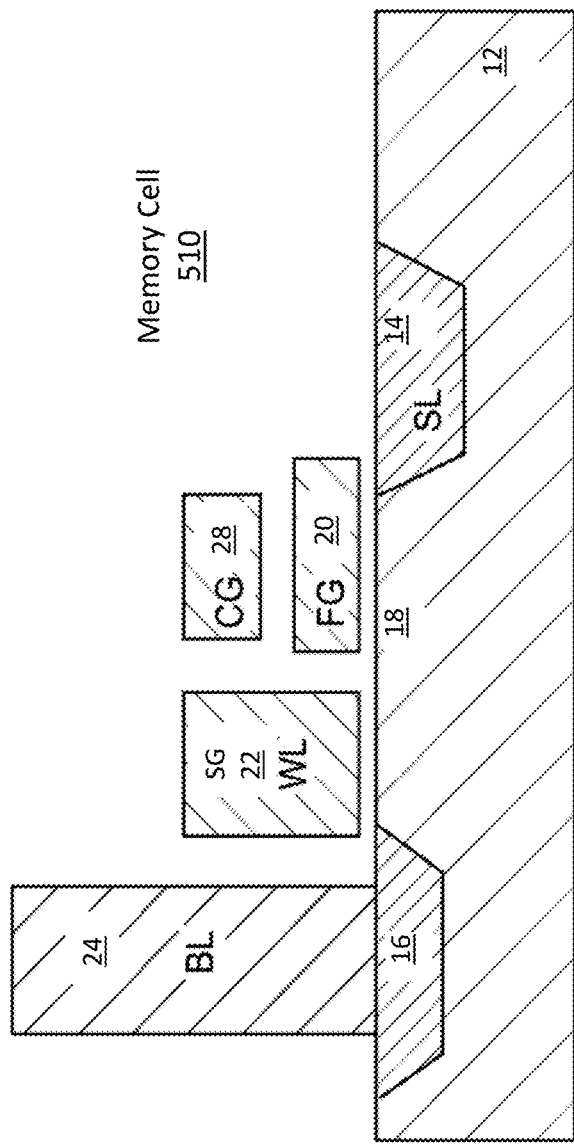
FIG. 5 depicts another prior art split gate flash memory cell

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 μA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

Figure 8:
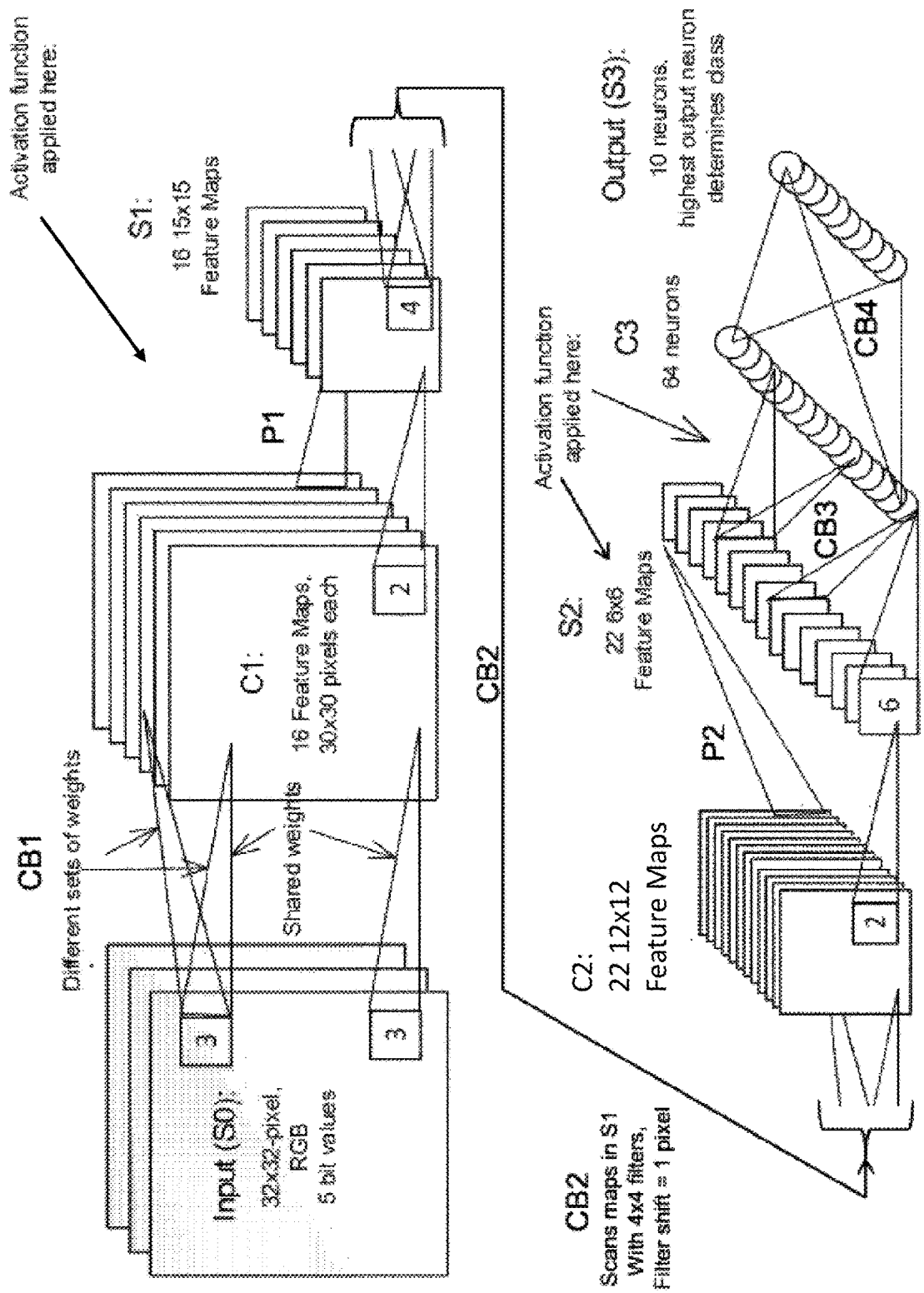
FIG. 8 is a diagram illustrating the different levels of an exemplary artificial neural network utilizing one or more VMM arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
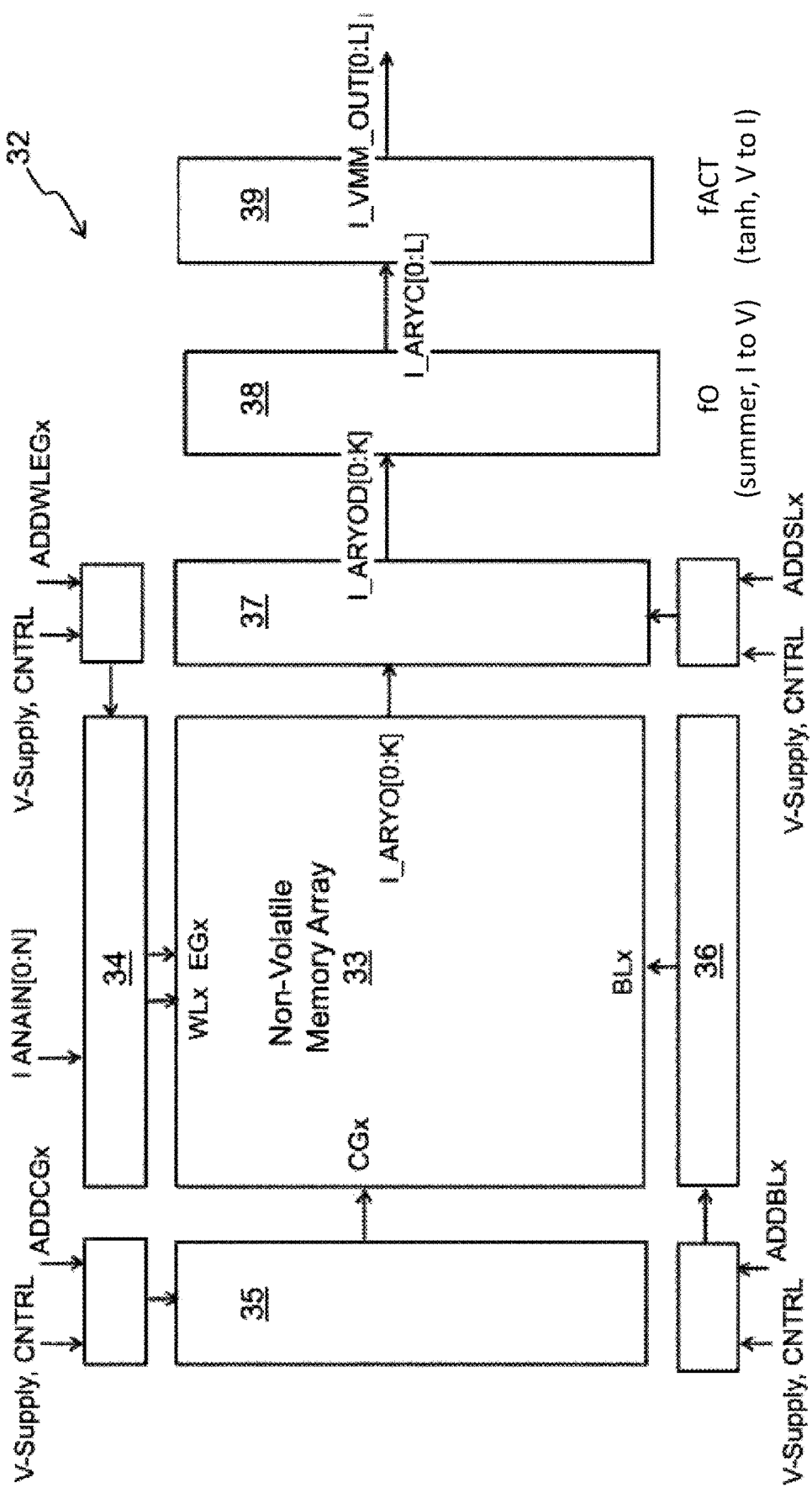
FIG. 9 is a block diagram illustrating a VMM system comprising a VMM array and other circuitry.

FIG. 9 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
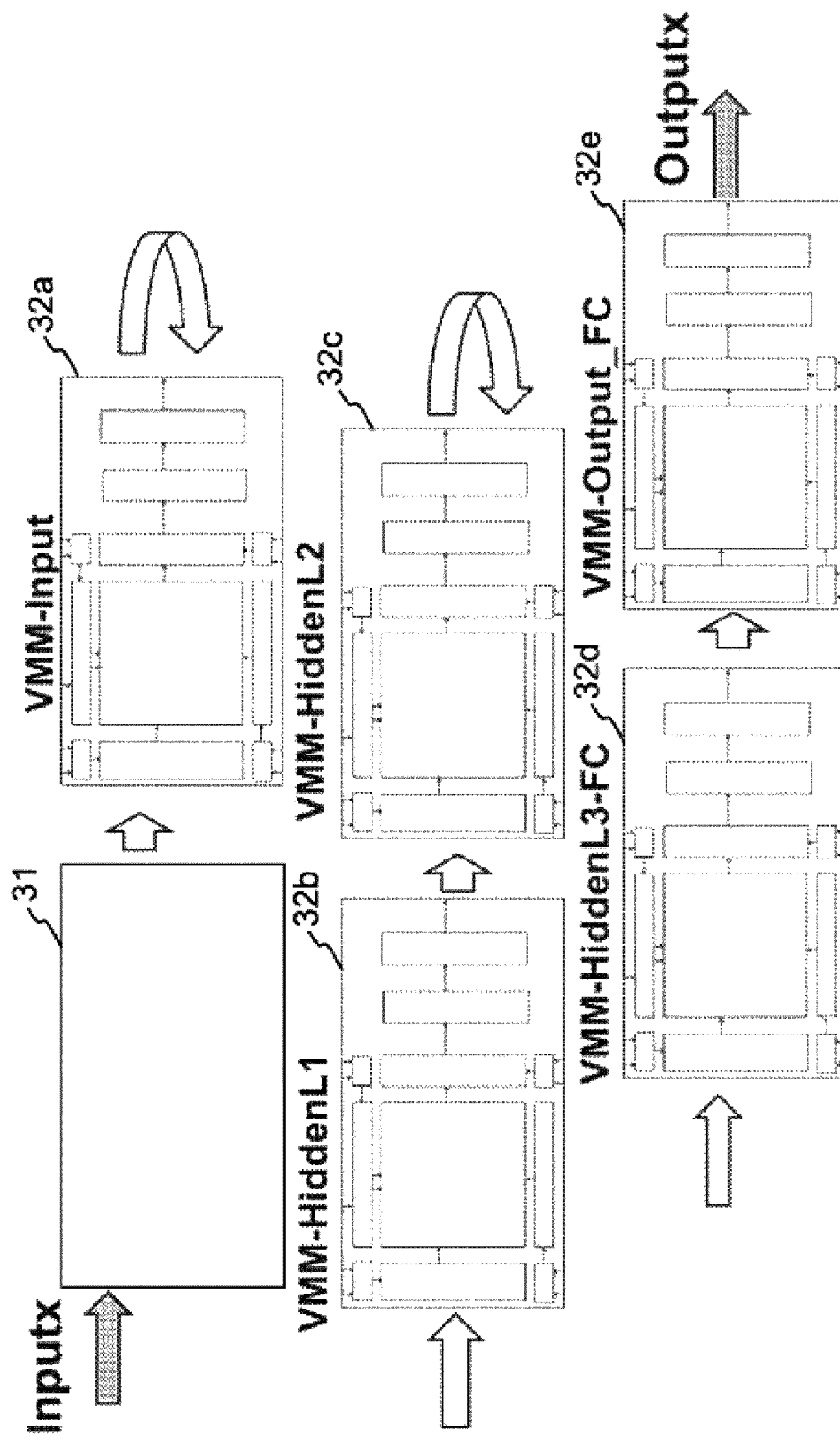
FIG. 10 is a block diagram illustrates an exemplary artificial neural network utilizing one or more VMM systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 10 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

Figure 11:
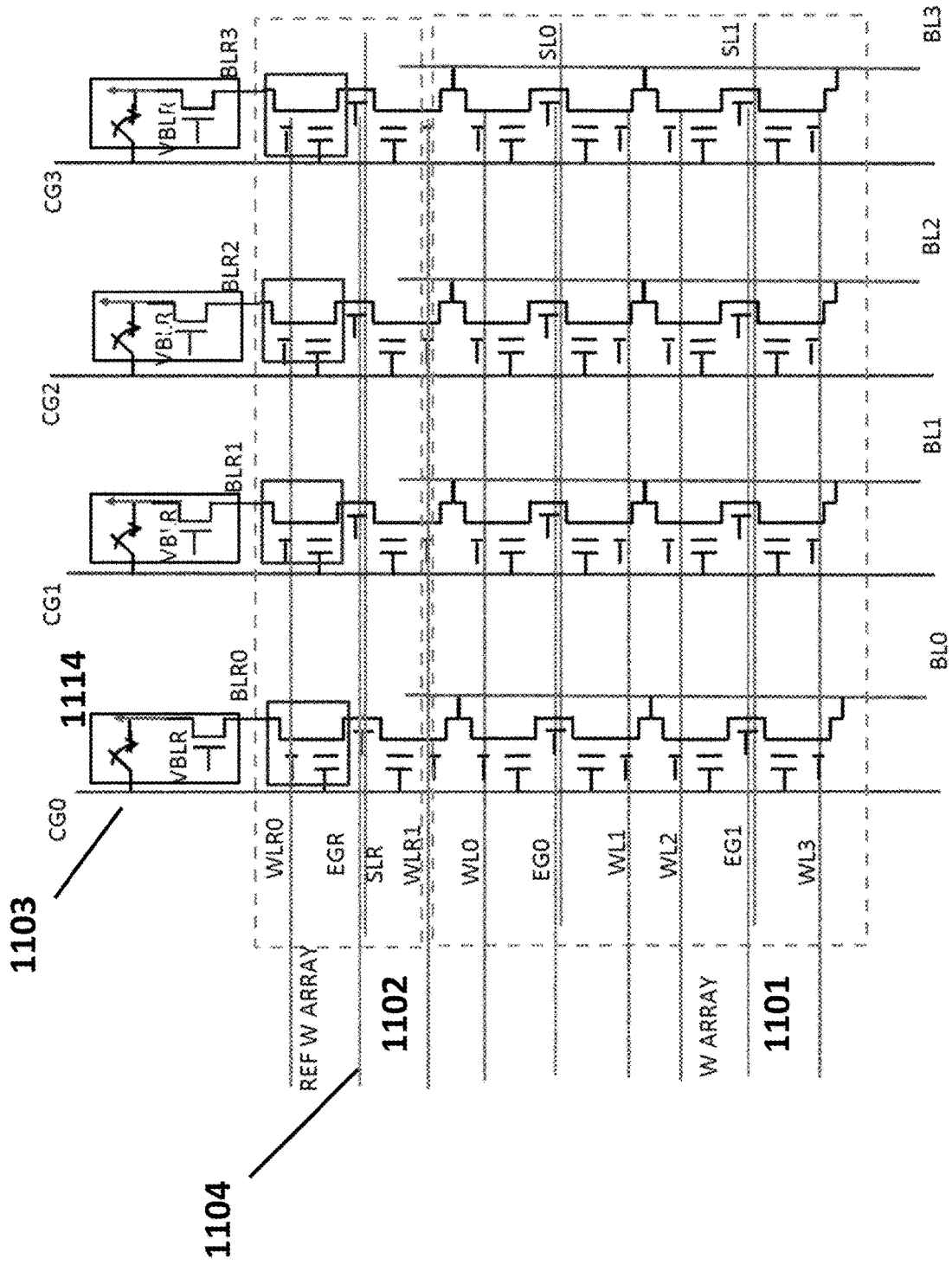
FIG. 11 depicts another embodiment of a VMM array.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For a memory array used as a vector matrix multiplier VMM array, the output current is:

$$Iout = wa*Io*e^{(Vg)/nVt} \text{ namely}$$

$$Iout = (wa/wp)*Iin = W*Iin$$

$$W = e^{(Vthp-Vtha)/nVt}$$

$$Iin = wp*Io*e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids = beta*(Vgs-Vth)*Vds; beta=u*Cox*Wt/L,$$

$$W\alpha(Vgs-Vth),$$

meaning weight W in the linear region is proportional to (Vgs-Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \tfrac{1}{2}*beta*(Vgs-Vth)^2; beta=u*Cox*Wt/L$$

$W\alpha(Vgs-Vth)^2$, meaning weight W is proportional to $(Vgs-Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation).

Other embodiments for VMM array 33 of FIG. 9 are described in U.S. patent application Ser. No. 15/826,345, which is incorporated by reference herein. As described in that application, a sourceline or a bitline can be used as the neuron output (current summation output).

Figure 12:
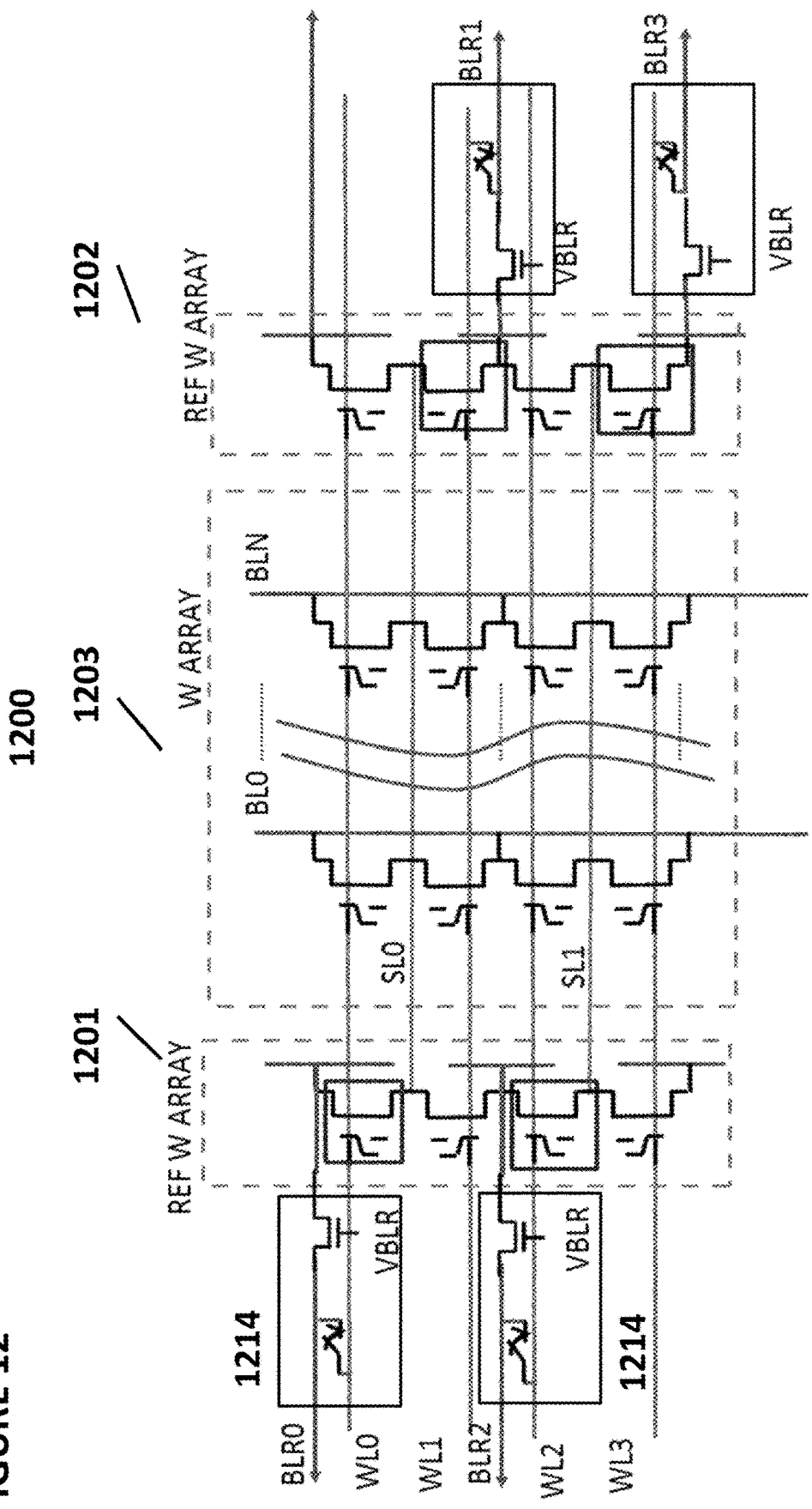
FIG. 12 depicts another embodiment of a VMM array.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3)
by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

Figure 13:
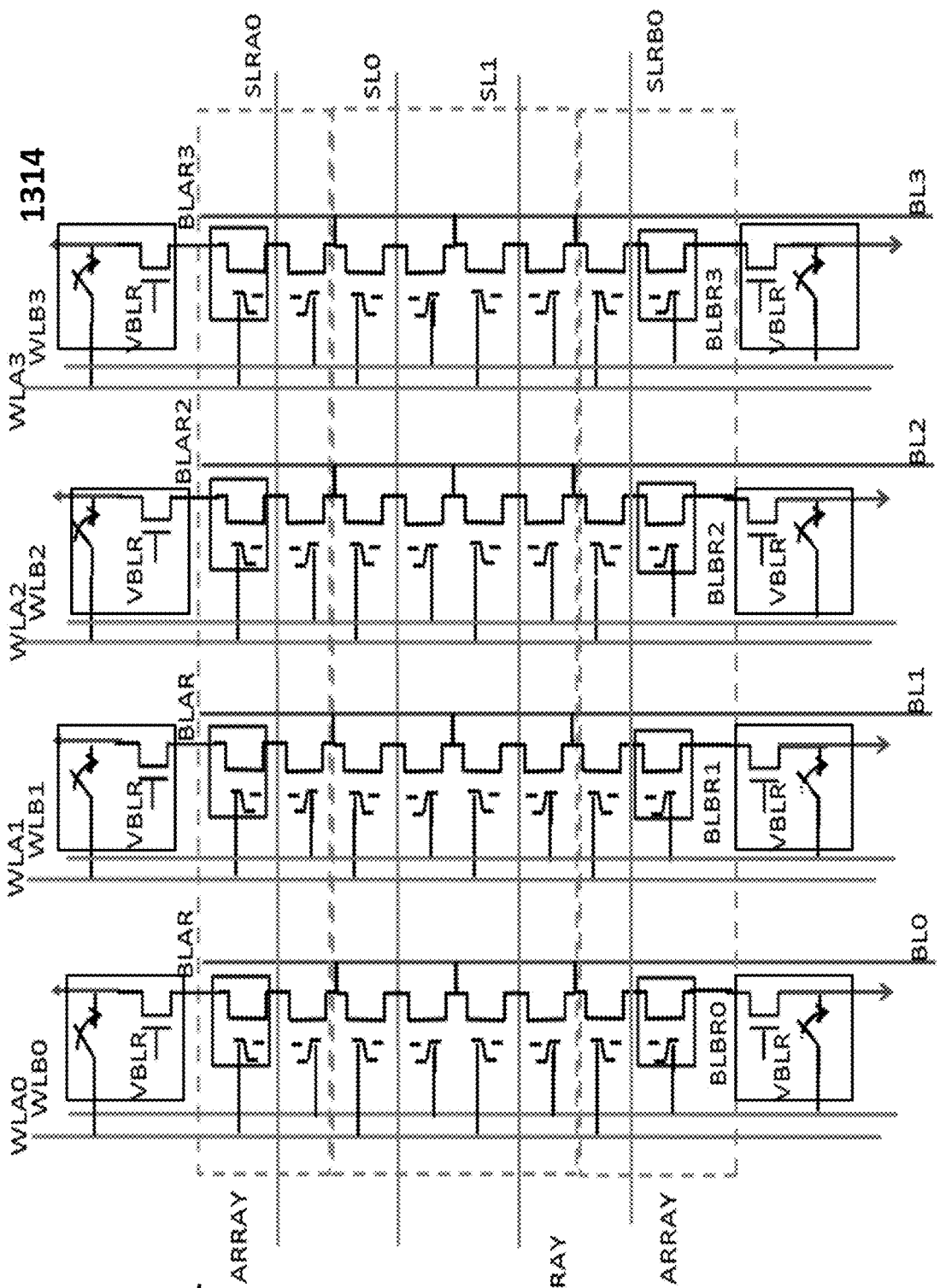
FIG. 13 depicts another embodiment of a VMM array.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| | | | | Operation of VMM Array 1300 of FIG. 13 | | |
|---|---|---|---|---|---|---|
| | WL | WL -unsel | BL | BL -unsel | SL | SL -unsel |
| Read | 0.5-3.5 V | −0.5 V/0 V | 0.1-2 V | 0.1 V-2 V/FLT | −0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 14:
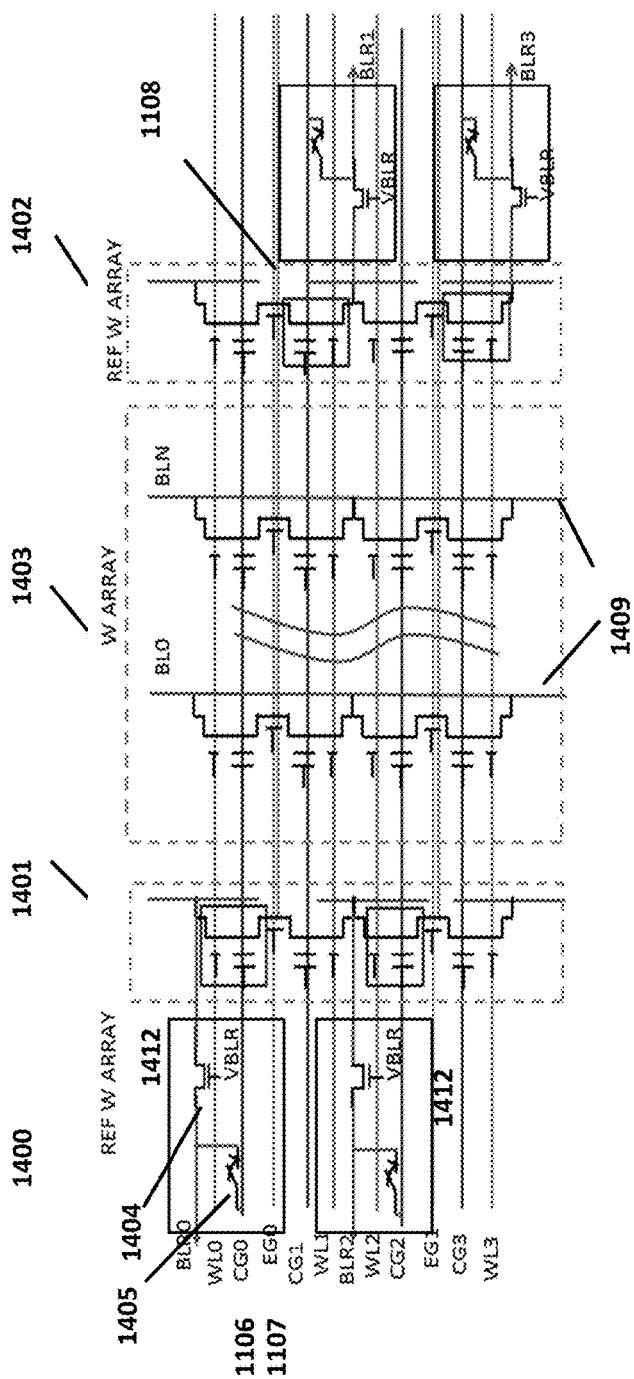
FIG. 14 depicts another embodiment of a VMM array.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400.

TABLE NO. 5

| | | | Operation of VMM Array 1200 of FIG. 12 | | | |
|---|---|---|---|---|---|---|
| | WL | WL -unsel | BL | BL -unsel | SL | SL -unsel |
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 15:
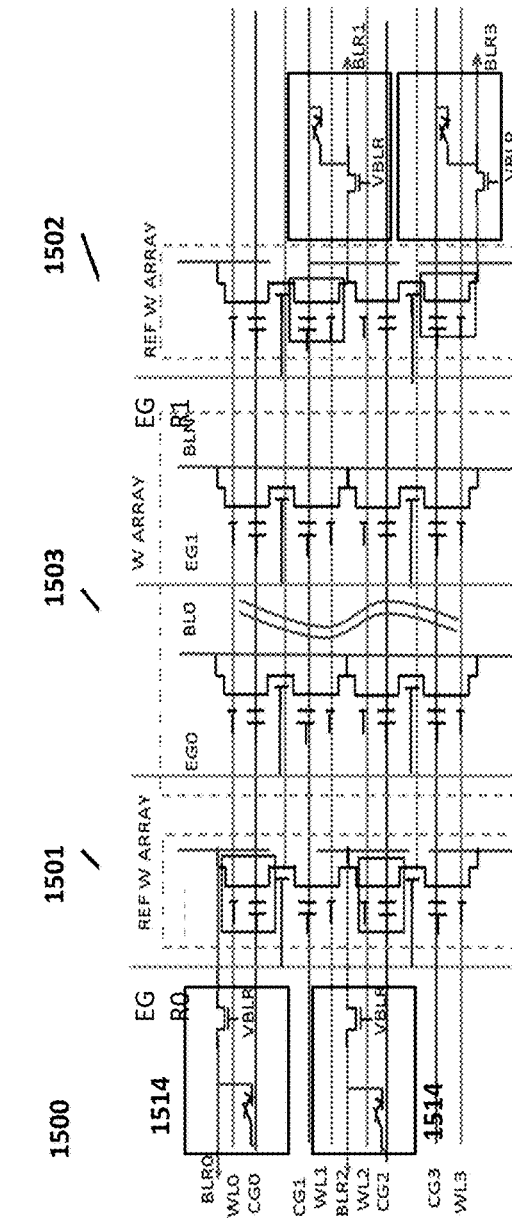
FIG. 15 depicts another embodiment of a VMM array.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1500 of FIG. 15

| | WL | WL - unsel | BL | BL - unsel | CG | CG -unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 16:
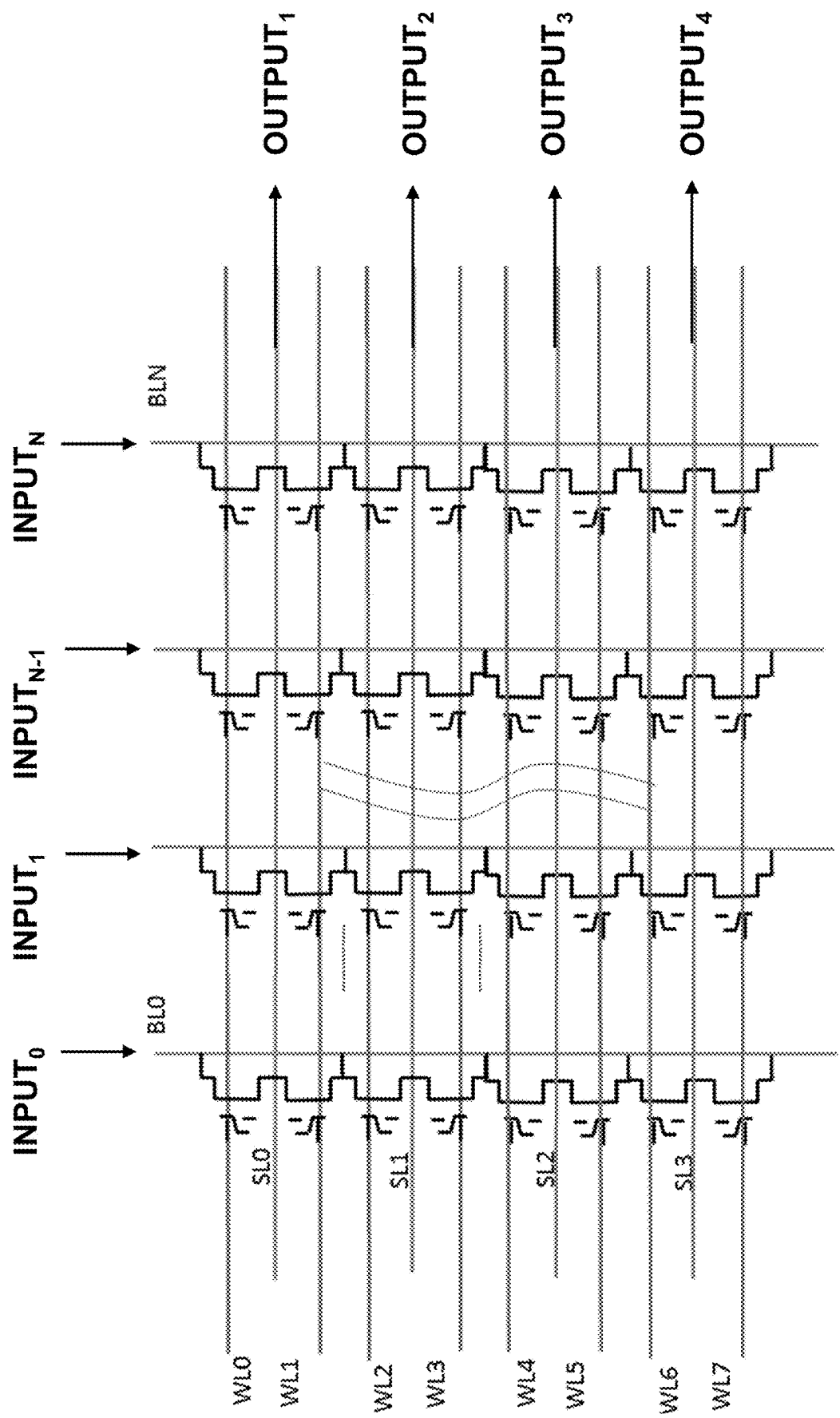
FIG. 16 depicts another embodiment of a VMM array.

FIG. 16 depicts neuron VMM array 1600, which is particularly suited for memory cells 210 as shown in FIG. 2, and is utilized as the synapses and parts of neurons between an input layer and the next layer. In VMM array 1600, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 17:
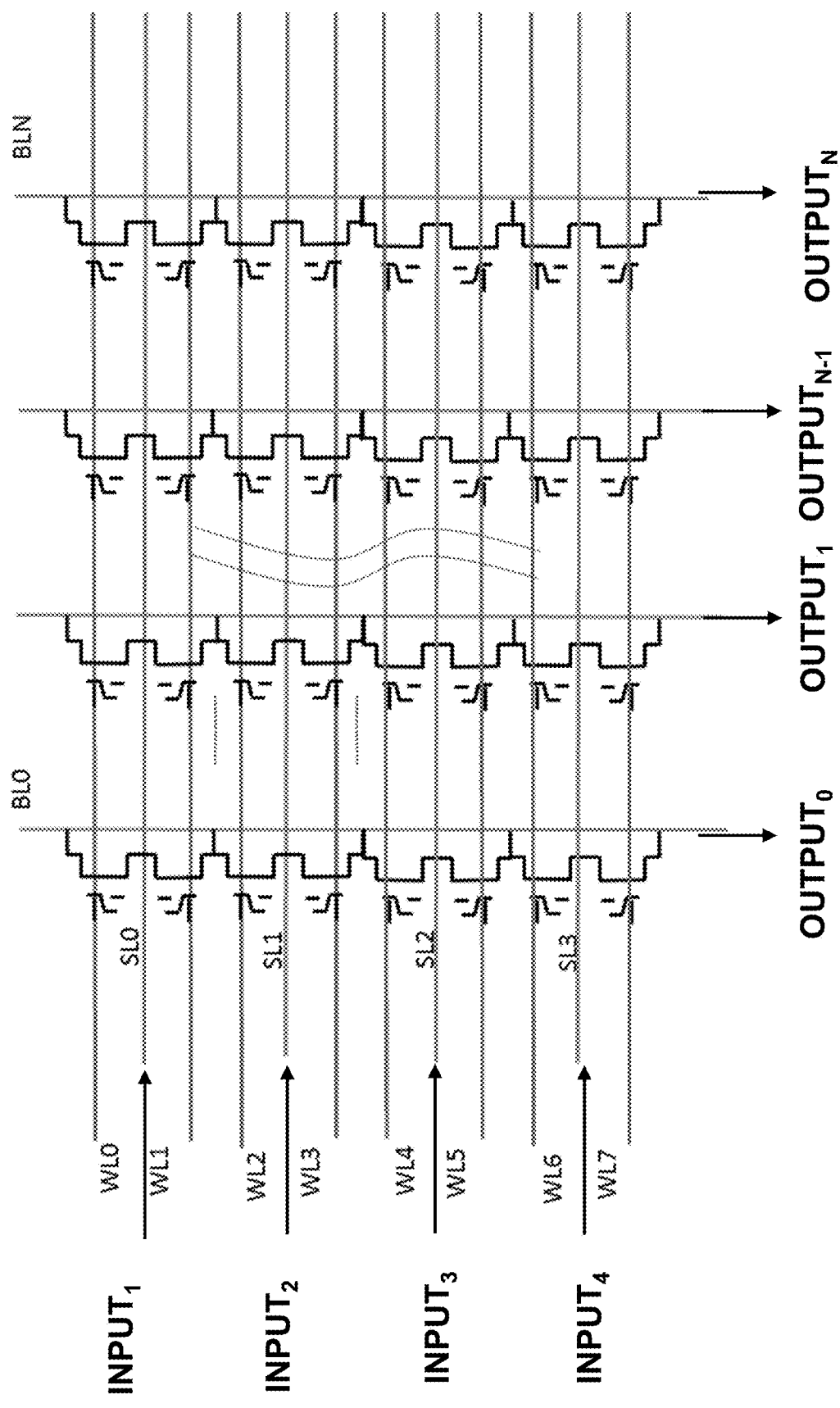
FIG. 17 depicts another embodiment of a VMM array.

FIG. 17 depicts neuron VMM array 1700, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 18:
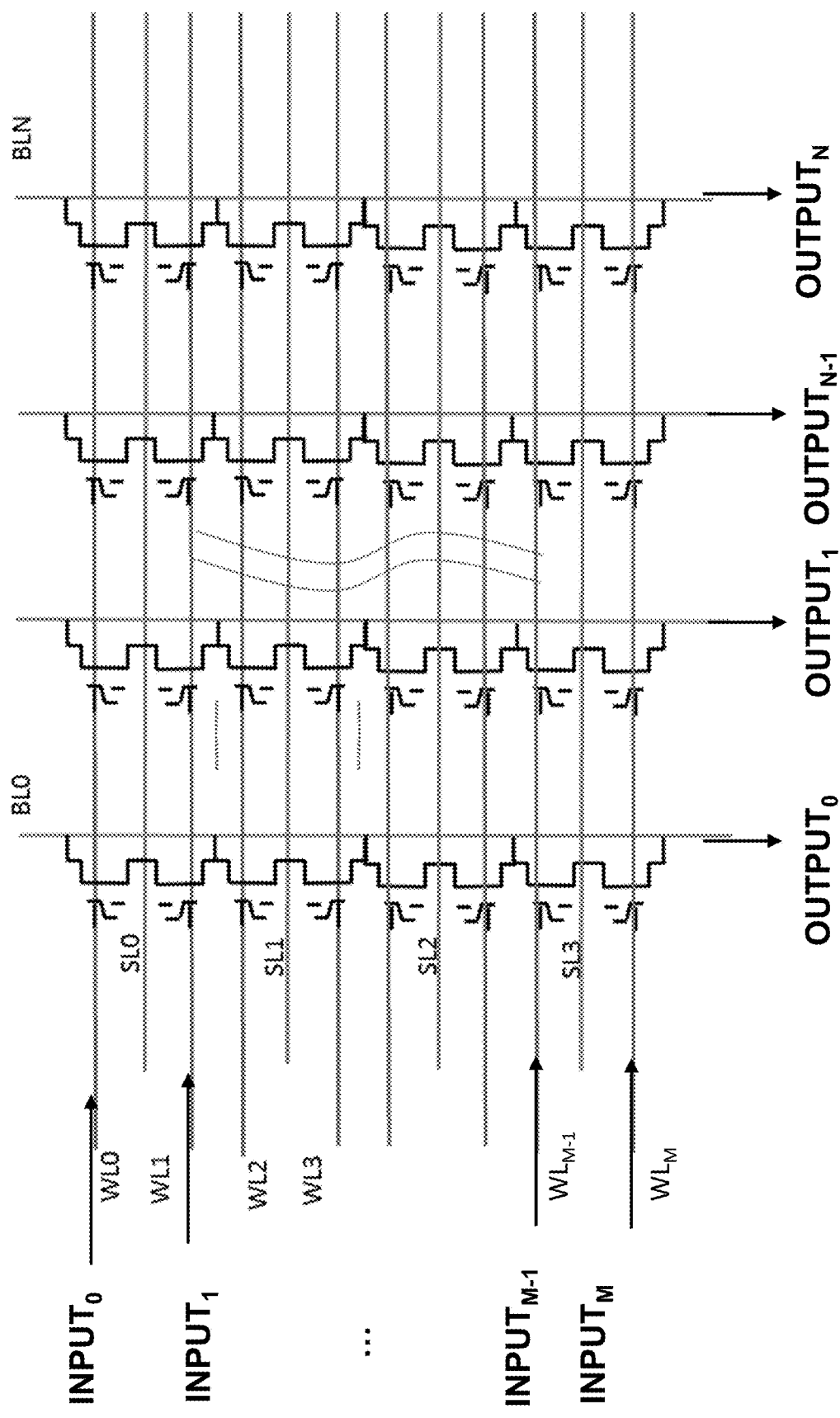
FIG. 18 depicts another embodiment of a VMM array.

FIG. 18 depicts neuron VMM array 1800, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, BL_N$.

Figure 19:
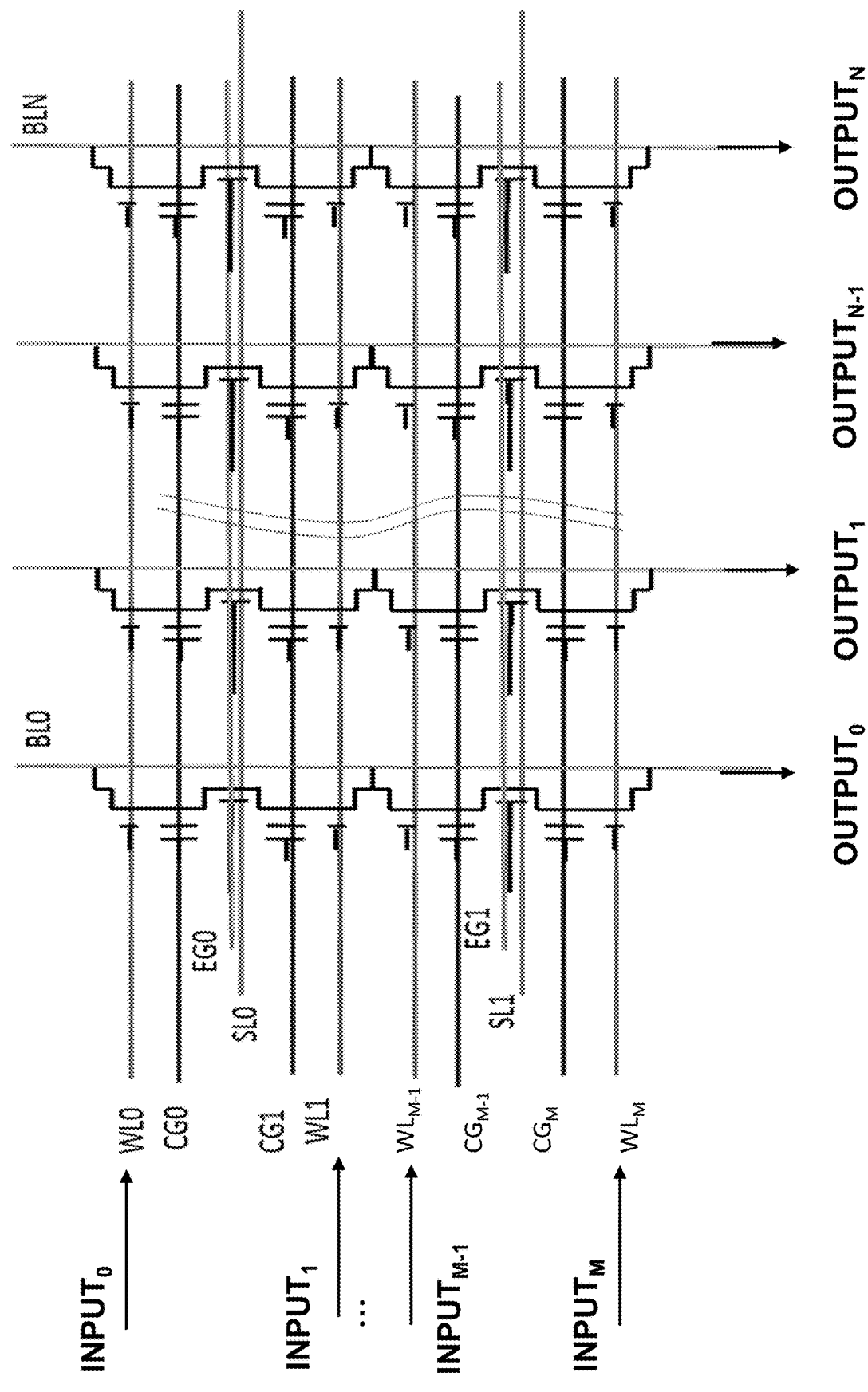
FIG. 19 depicts another embodiment of a VMM array.

FIG. 19 depicts neuron VMM array 1900, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 20:
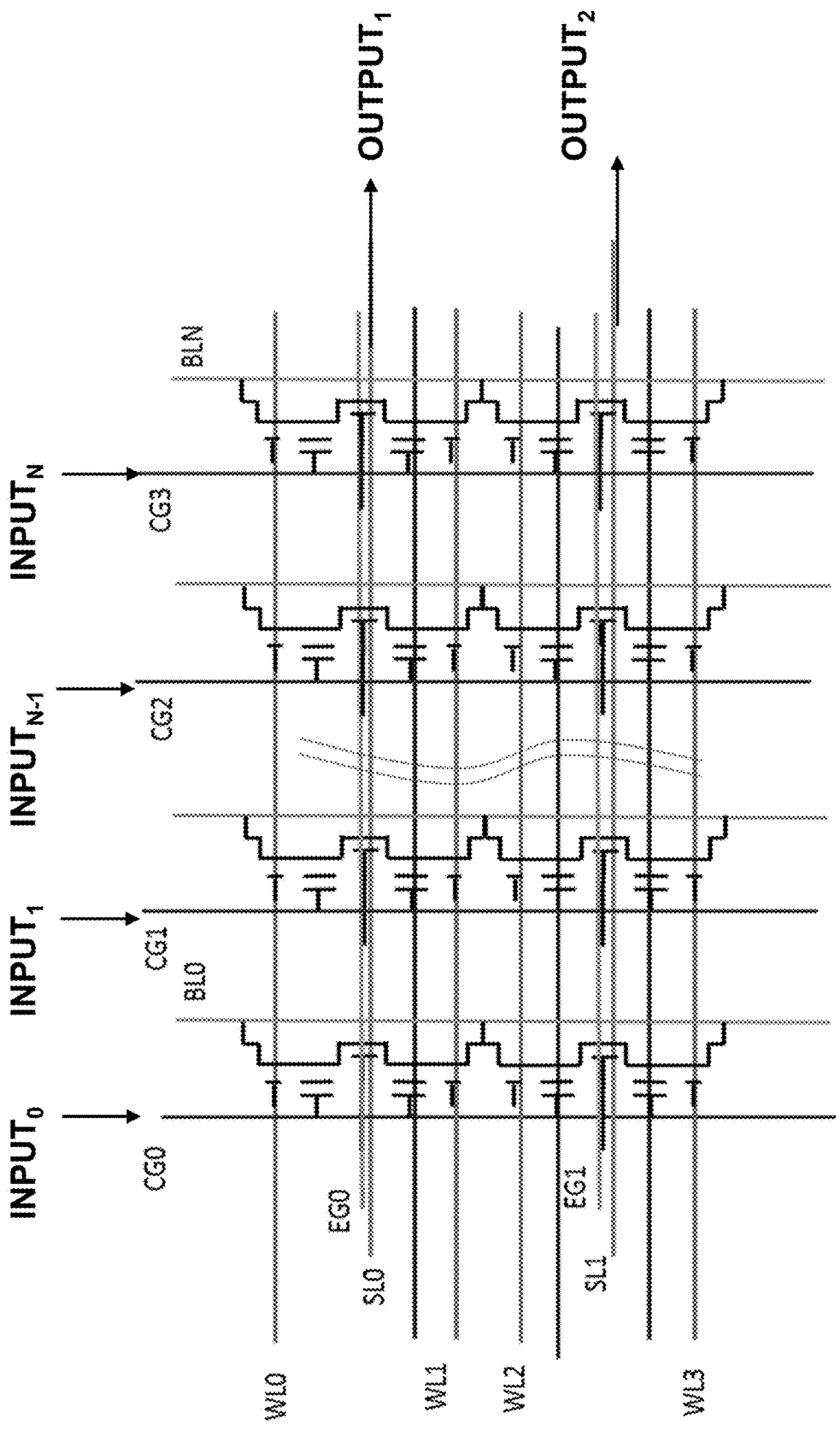
FIG. 20 depicts another embodiment of a VMM array.

FIG. 20 depicts neuron VMM array 2000, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines SL0 and SL1'.

Figure 21:
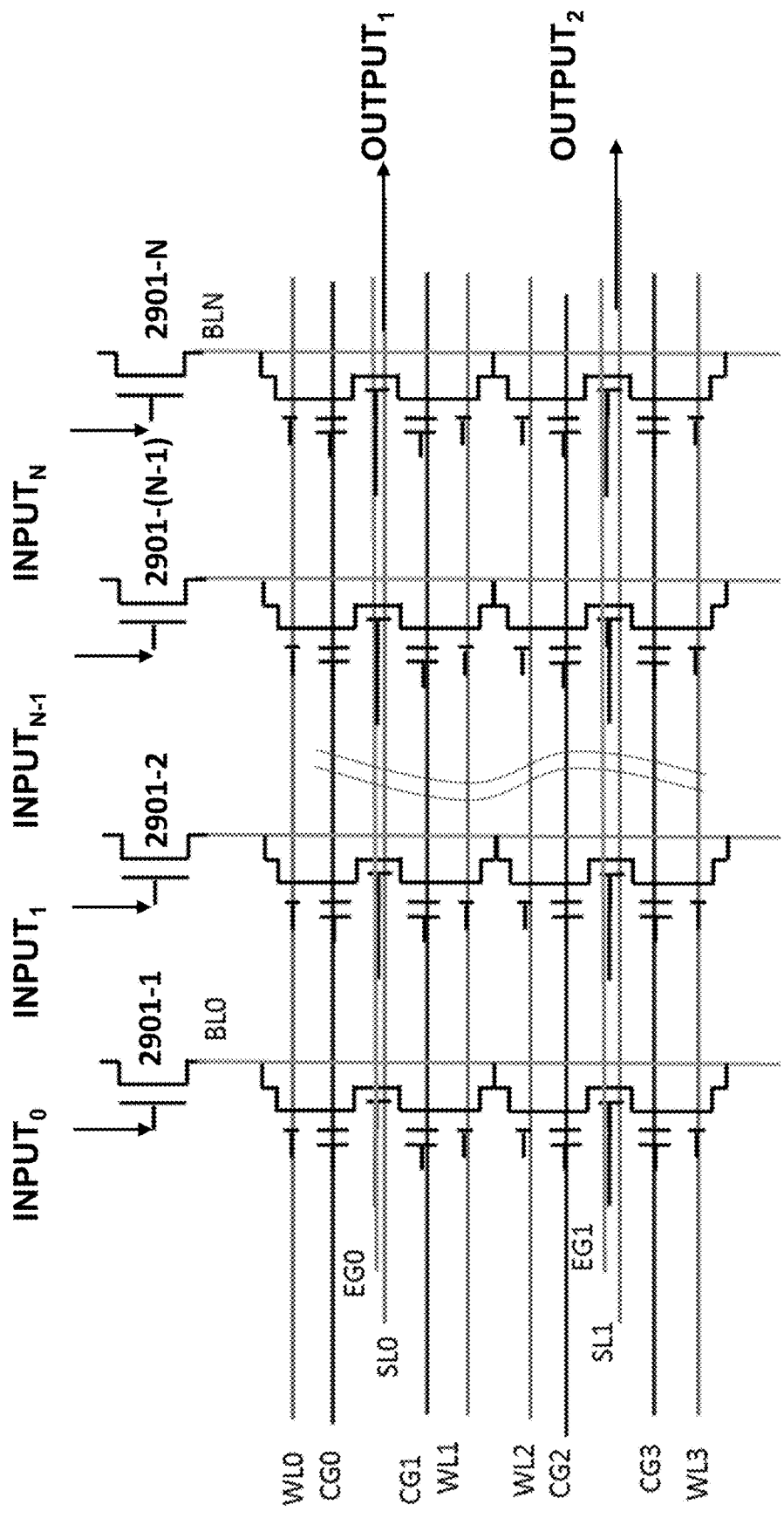
FIG. 21 depicts another embodiment of a VMM array.

FIG. 21 depicts neuron VMM array 2100, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2901-1, 2901-2, ..., 2901-(N−1), and 2901-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$.

Figure 22:
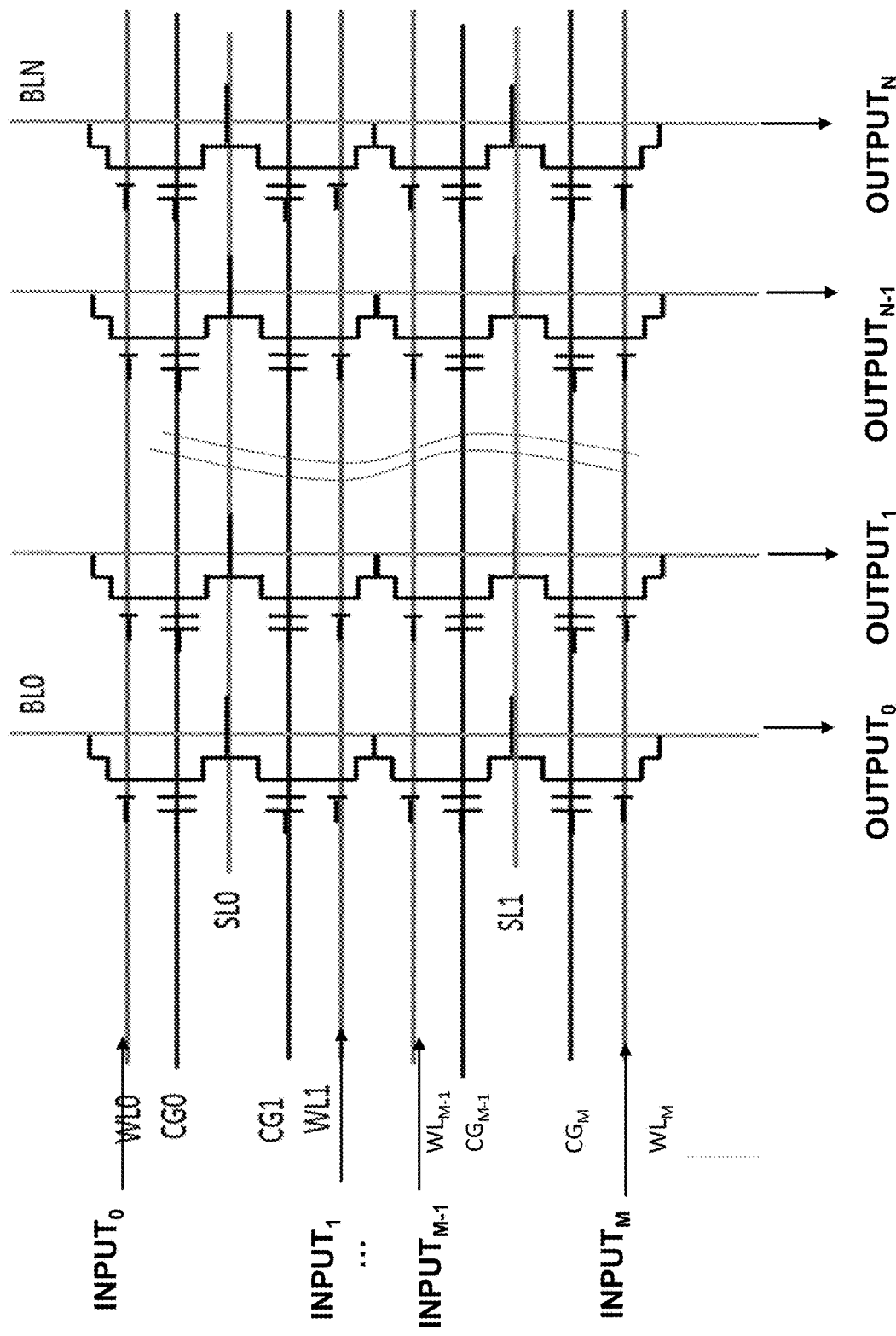
FIG. 22 depicts another embodiment of a VMM array.

FIG. 22 depicts neuron VMM array 2200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, BL_N$, respectively.

Figure 23:
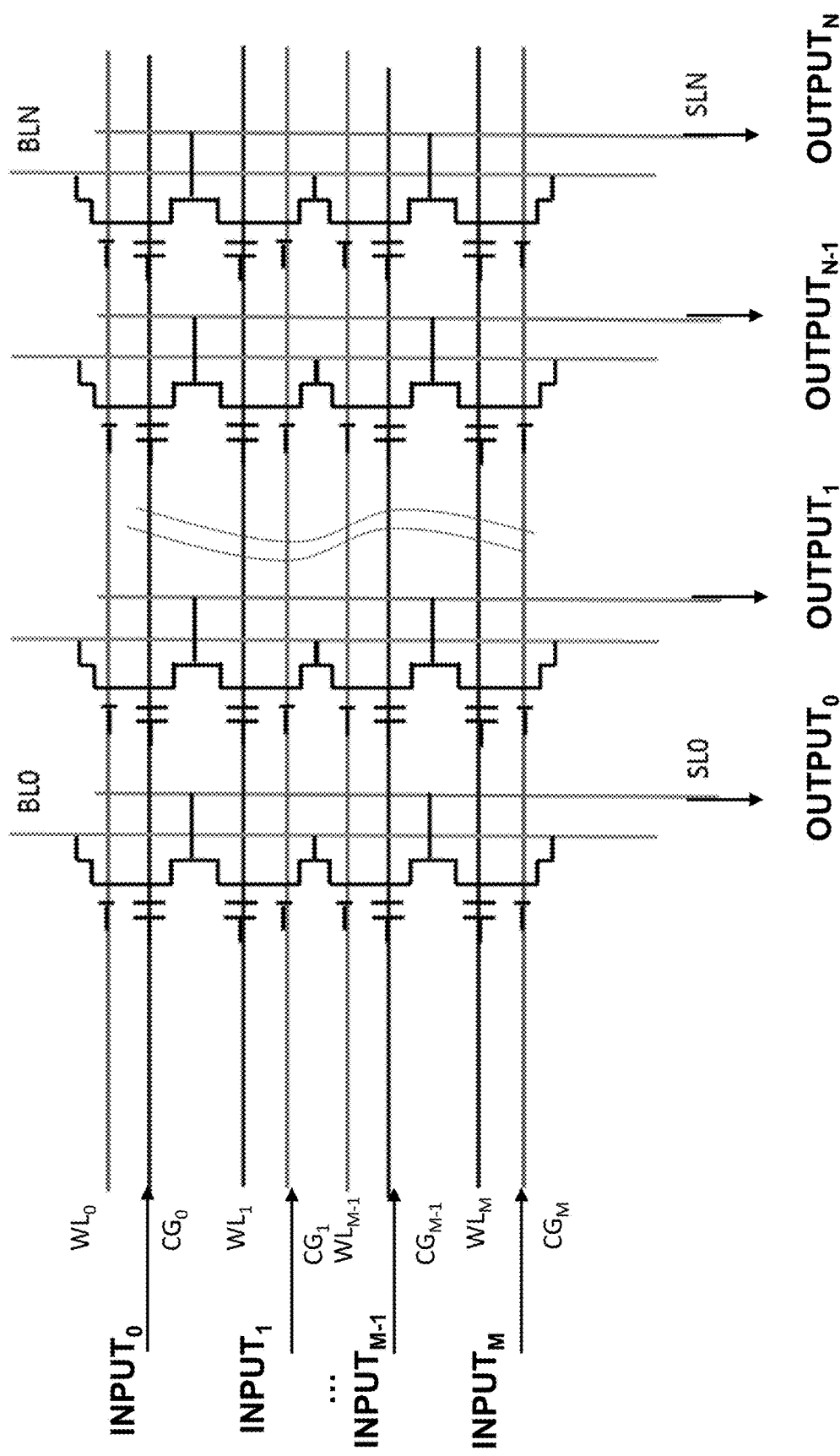
FIG. 23 depicts another embodiment of a VMM array.

FIG. 23 depicts neuron VMM array 2300, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line SL is coupled to the source lines of all memory cells in column i.

Figure 24:
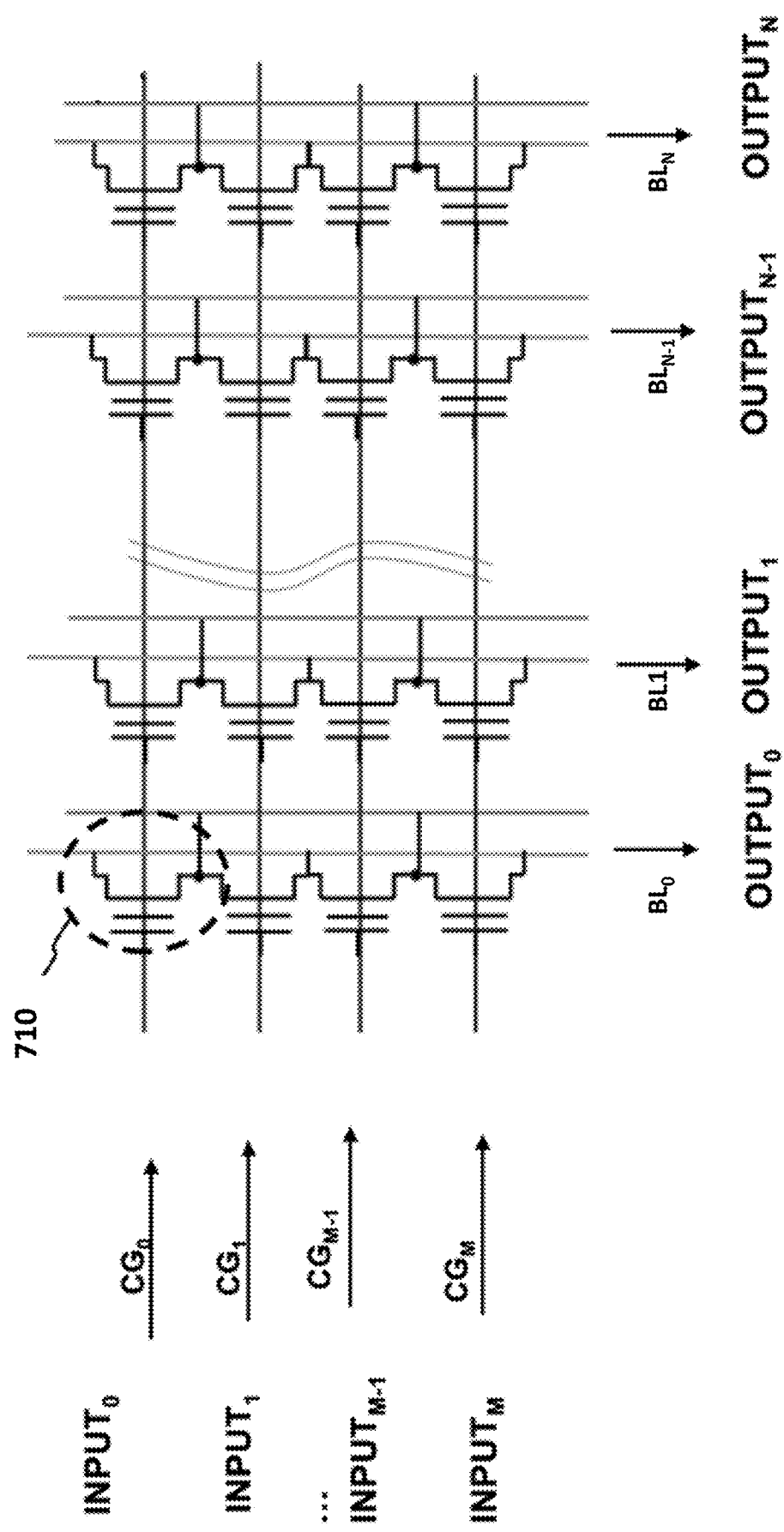
FIG. 24 depicts another embodiment of a VMM array.

FIG. 24 depicts neuron VMM array 2400, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTMs often are used in artificial neural networks. LSTM allows an artificial neural network to remember information over predetermined arbitrary time intervals and to use that information in subsequent operations. A conventional LSTM comprises a cell, an input gate, an output gate, and a forget gate. The three gates regulate the flow of information into and out of the cell and the time interval that the information is remembered in the LSTM. VMMs are particularly useful in LSTMs.

Figure 25:
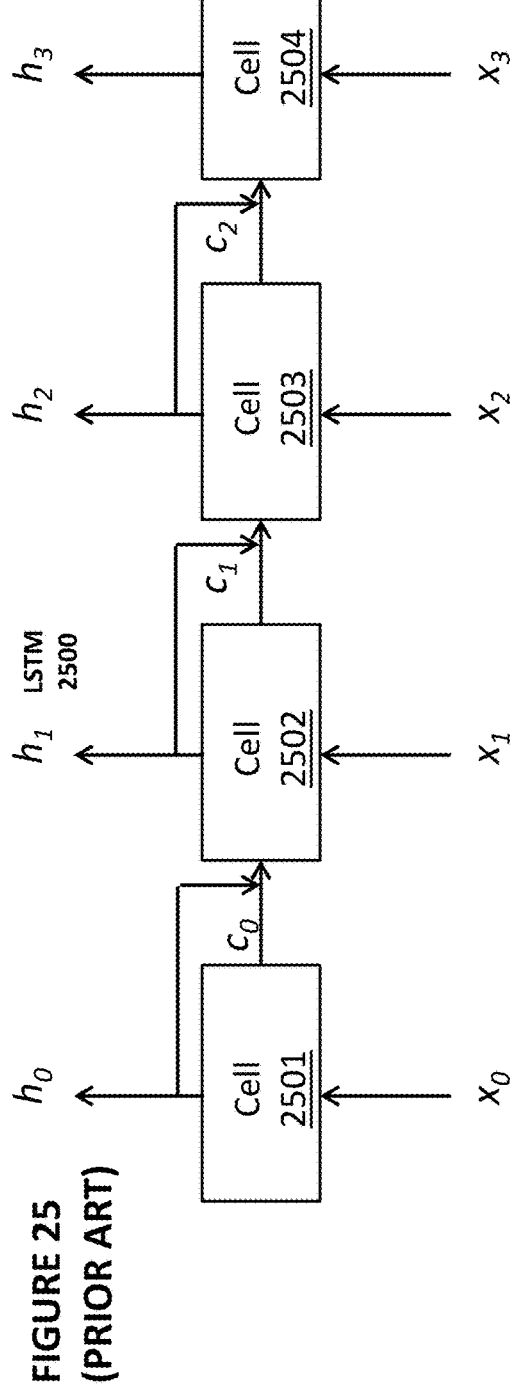
FIG. 25 depicts a prior art long short-term memory system.

FIG. 25 depicts an exemplary LSTM 2500. LSTM 2500 in this example comprises cells 2501, 2502, 2503, and 2504. Cell 2501 receives input vector $x_0$ and generates output vector $h_0$ and cell state vector $c_0$. Cell 2502 receives input vector $x_1$, the output vector (hidden state) $h_0$ from cell 2501, and cell state $c_0$ from cell 2501 and generates output vector $h_1$ and cell state vector $c_1$. Cell 2503 receives input vector $x_2$, the output vector (hidden state) $h_1$ from cell 2502, and cell state $c_1$ from cell 2502 and generates output vector $h_2$ and cell state vector $c_2$. Cell 2504 receives input vector $x_3$, the output vector (hidden state) $h_2$ from cell 2503, and cell state $c_2$ from cell 2503 and generates output vector $h_3$. Additional cells can be used, and an LSTM with four cells is merely an example.

Figure 26:
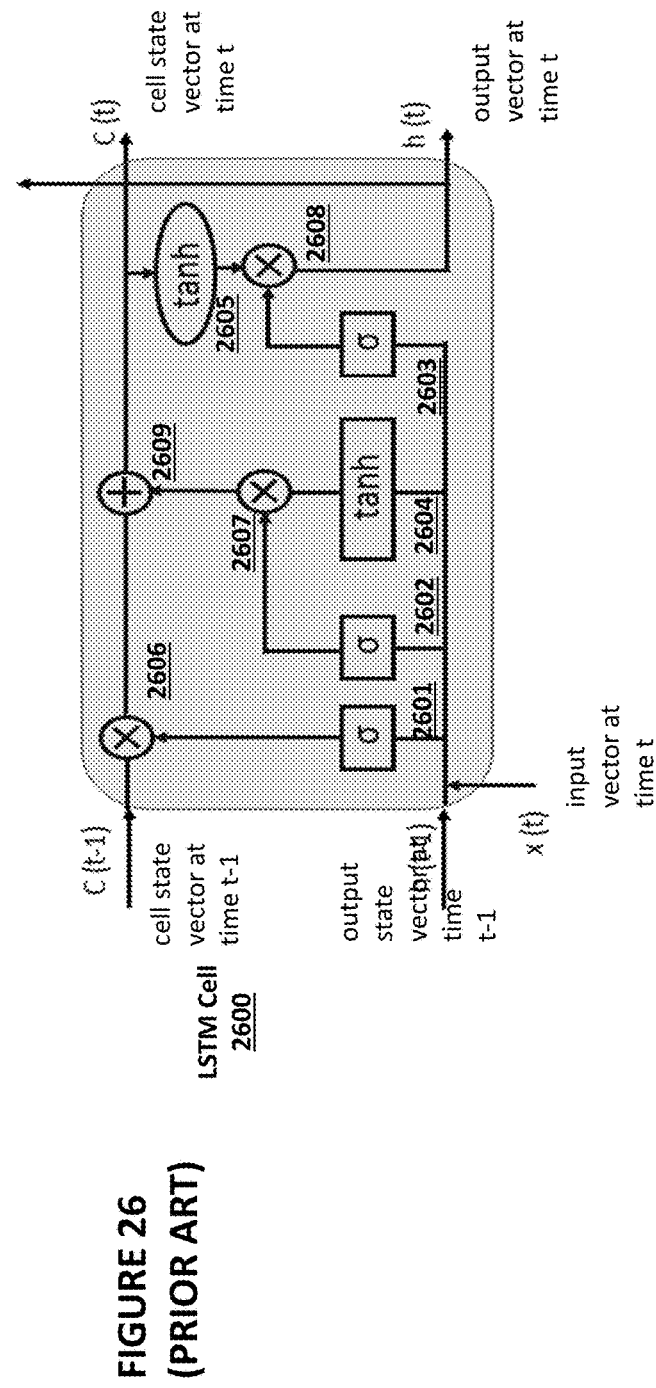
FIG. 26 depicts an exemplary cell for use in a long short-term memory system.

FIG. 26 depicts an exemplary implementation of an LSTM cell 2600, which can be used for cells 2501, 2502, 2503, and 2504 in FIG. 25. LSTM cell 2600 receives input vector x(t), cell state vector c(t−1) from a preceding cell, and output vector h(t−1) from a preceding cell, and generates cell state vector c(t) and output vector h(t).

LSTM cell 2600 comprises sigmoid function devices 2601, 2602, and 2603, each of which applies a number between 0 and 1 to control how much of each component in the input vector is allowed through to the output vector. LSTM cell 2600 also comprises tan h devices 2604 and 2605 to apply a hyperbolic tangent function to an input vector, multiplier devices 2606, 2607, and 2608 to multiply two vectors together, and addition device 2609 to add two vectors together. Output vector h(t) can be provided to the next LSTM cell in the system, or it can be accessed for other purposes.

Figure 27:
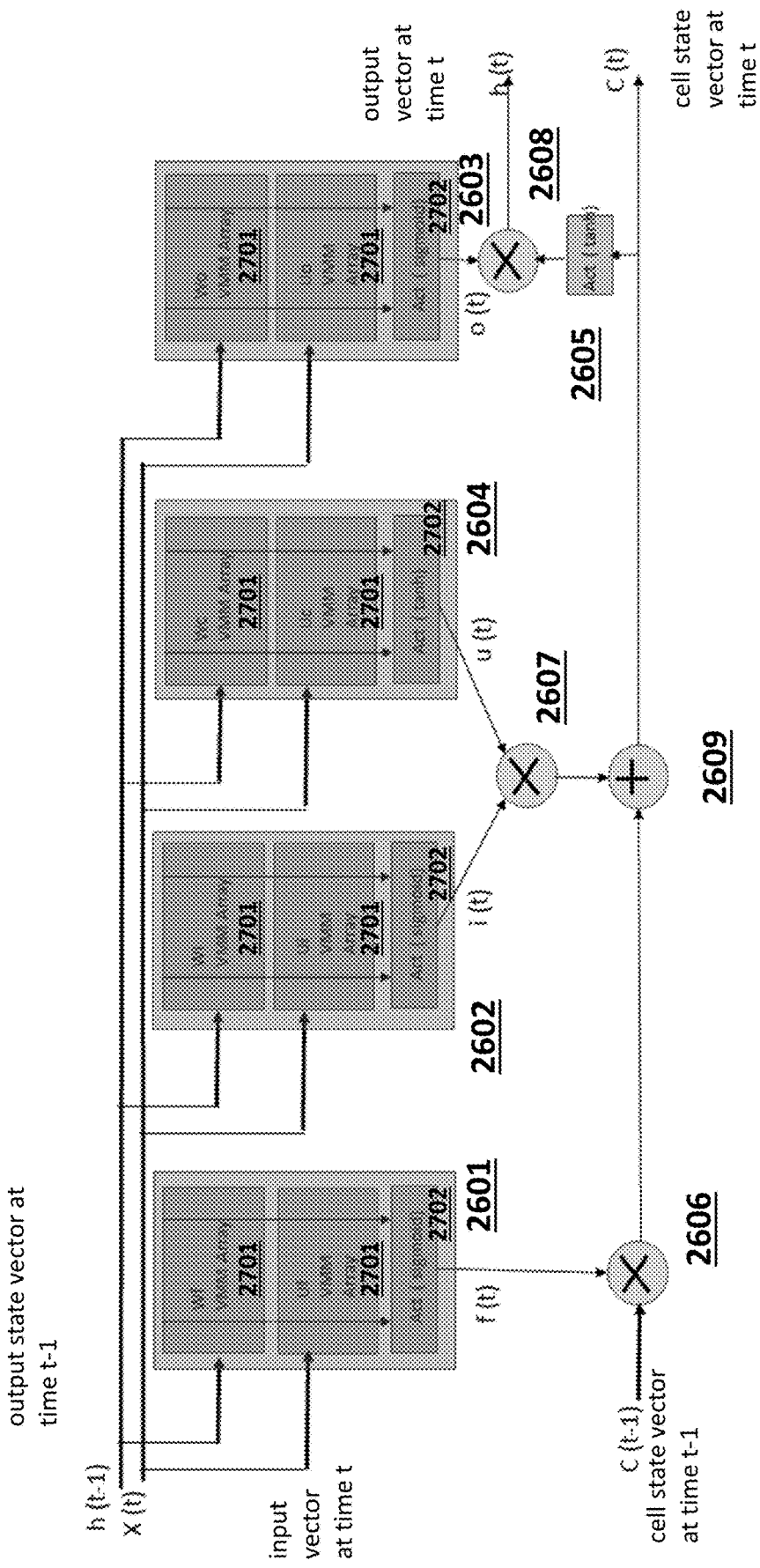
FIG. 27 depicts an embodiment of the exemplary cell of FIG. 26.

FIG. 27 depicts an LSTM cell 2700, which is an example of an implementation of LSTM cell 2600. For the reader's convenience, the same numbering from LSTM cell 2600 is used in LSTM cell 2700. Sigmoid function devices 2601, 2602, and 2603 and tan h device 2604 each comprise multiple VMM arrays 2701 and activation circuit blocks 2702, Thus, it can be seen that VMM arrays are particular useful in LSTM cells used in certain neural network systems.

Figure 28:
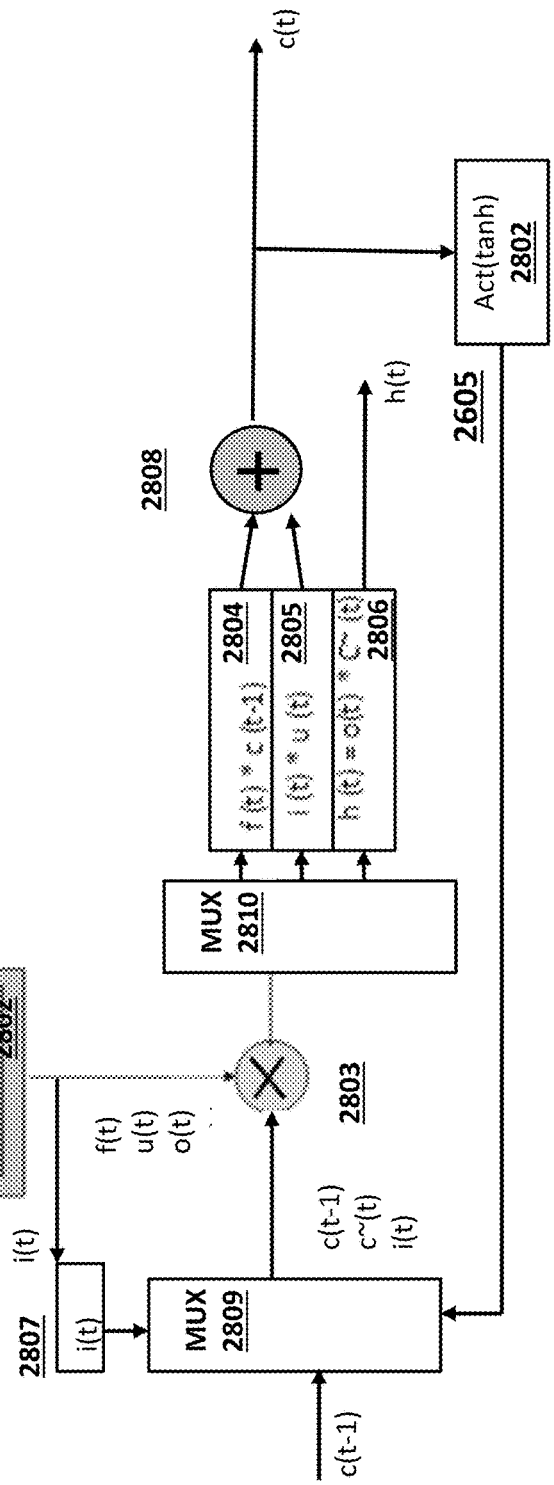
FIG. 28 depicts another embodiment of the exemplary cell of FIG. 26.

An alternative to LSTM cell 2700 (and another example of an implementation of LSTM cell 2600) is shown in FIG. 28. In FIG. 28, sigmoid function devices 2601, 2602, and 2603 and tan h device 2604 may share the same physical hardware (VMM arrays 2801 and activation function block 2802) in a time-multiplexed fashion. LSTM cell 2800 also comprises multiplier device 2803 to multiply two vectors together, addition device 2808 to add two vectors together, tan h device 2605 (which comprises activation circuit block 2802), register 2807 to store the value i(t) when i(t) is output from sigmoid function block 2802, register 2804 to store the value f(t) c(t−1) when that value is output from multiplier device 2803 through multiplexor 2810, register 2805 to store the value i(t)*u(t) when that value is output from multiplier device 2803 through multiplexor 2810, and register 2806 to store the value o(t)*c~(t) when that value is output from multiplier device 2803 through multiplexor 2810, and multiplexor 2809.

Whereas LSTM cell 2700 contains multiple sets of VMM arrays 2701 and respective activation function blocks 2702, LSTM cell 2800 contains only one set of VMM arrays 2801 and activation function block 2802, which are used to represent multiple layers in the embodiment of LSTM cell 2800. LSTM cell 2800 will require less space than LSTM 2700, as LSTM cell 2800 will require ¼ as much space for VMMs and activation function blocks compared to LSTM cell 2700.

It can be further appreciated that LSTM units will typically comprise multiple VMM arrays, each of which requires functionality provided by certain circuit blocks outside of the VMM arrays, such as a summer and activation circuit block and high voltage generation blocks, Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit). GRUs are a gating mechanism in recurrent artificial neural networks. GRUs are similar to LSTMs, except that GRU cells generally contain fewer components than an LSTM cell.

Figure 29:
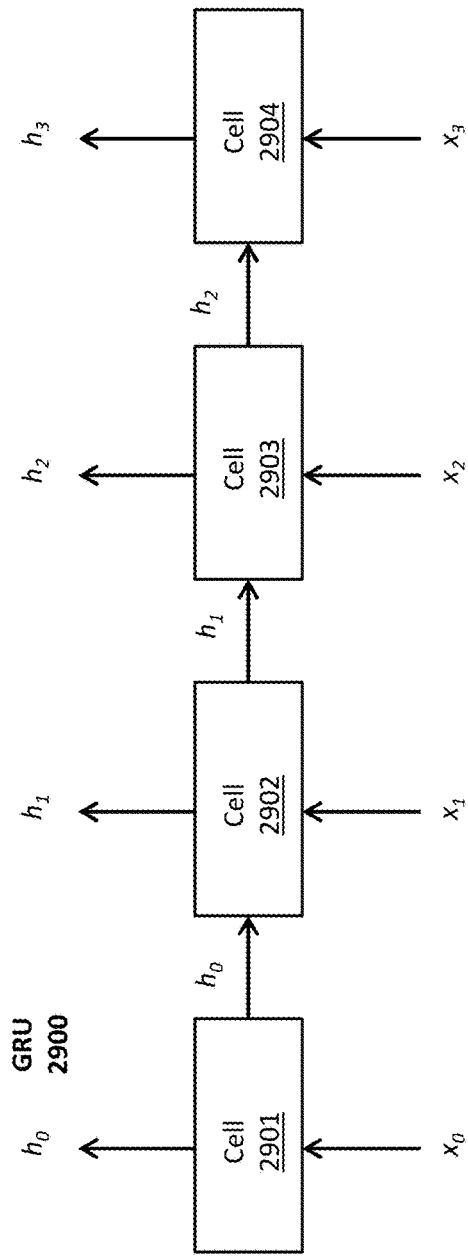
FIG. 29 depicts a prior art gated recurrent unit system.

FIG. 29 depicts an exemplary GRU 2900. GRU 2900 in this example comprises cells 2901, 2902, 2903, and 2904. Cell 2901 receives input vector $x_0$ and generates output vector $h_0$. Cell 2902 receives input vector $x_1$, the output vector $h_0$ from cell 2901 and generates output vector $h_1$. Cell 2903 receives input vector $x_2$ and the output vector (hidden state) $h_1$ from cell 2902 and generates output vector $h_2$. Cell 2904 receives input vector $x_3$ and the Output vector (hidden state) $h_2$ from cell 2903 and generates output vector $h_3$. Additional cells can be used, and an GRU with four cells is merely an example.

Figure 30:
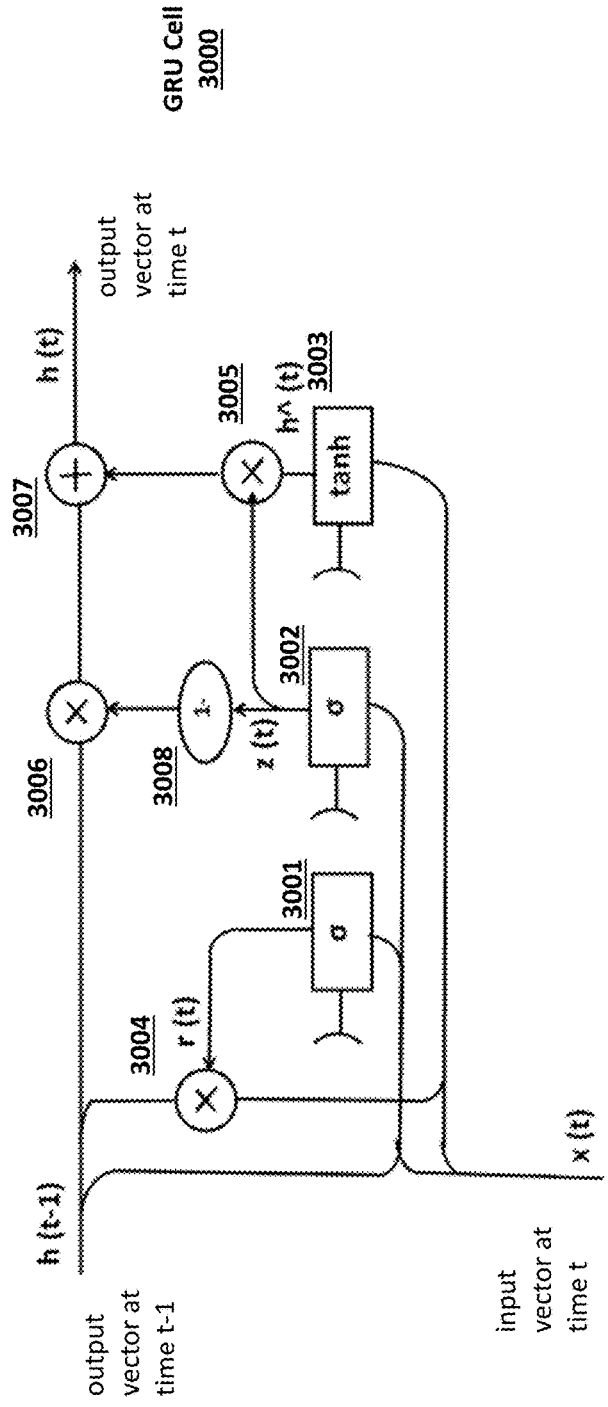
FIG. 30 depicts an exemplary cell for use in a gated recurrent unit system.

FIG. 30 depicts an exemplary implementation of a GRU cell 3000, which can be used for cells 2901, 2902, 2903, and 2904 of FIG. 29. GRU cell 3000 receives input vector x(t) and output vector h(t−1) from a preceding GRU cell and generates output vector h(t). GRU cell 3000 comprises sigmoid function devices 3001 and 3002, each of which applies a number between 0 and 1 to components from output vector h(t−1) and input vector x(t). GRU cell 3000 also comprises a tan h device 3003 to apply a hyperbolic tangent function to an input vector, a plurality of multiplier devices 3004, 3005, and 3006 to multiply two vectors together, an addition device 3007 to add two vectors together, and a complementary device 3008 to subtract an input from 1 to generate an output.

Figure 31:
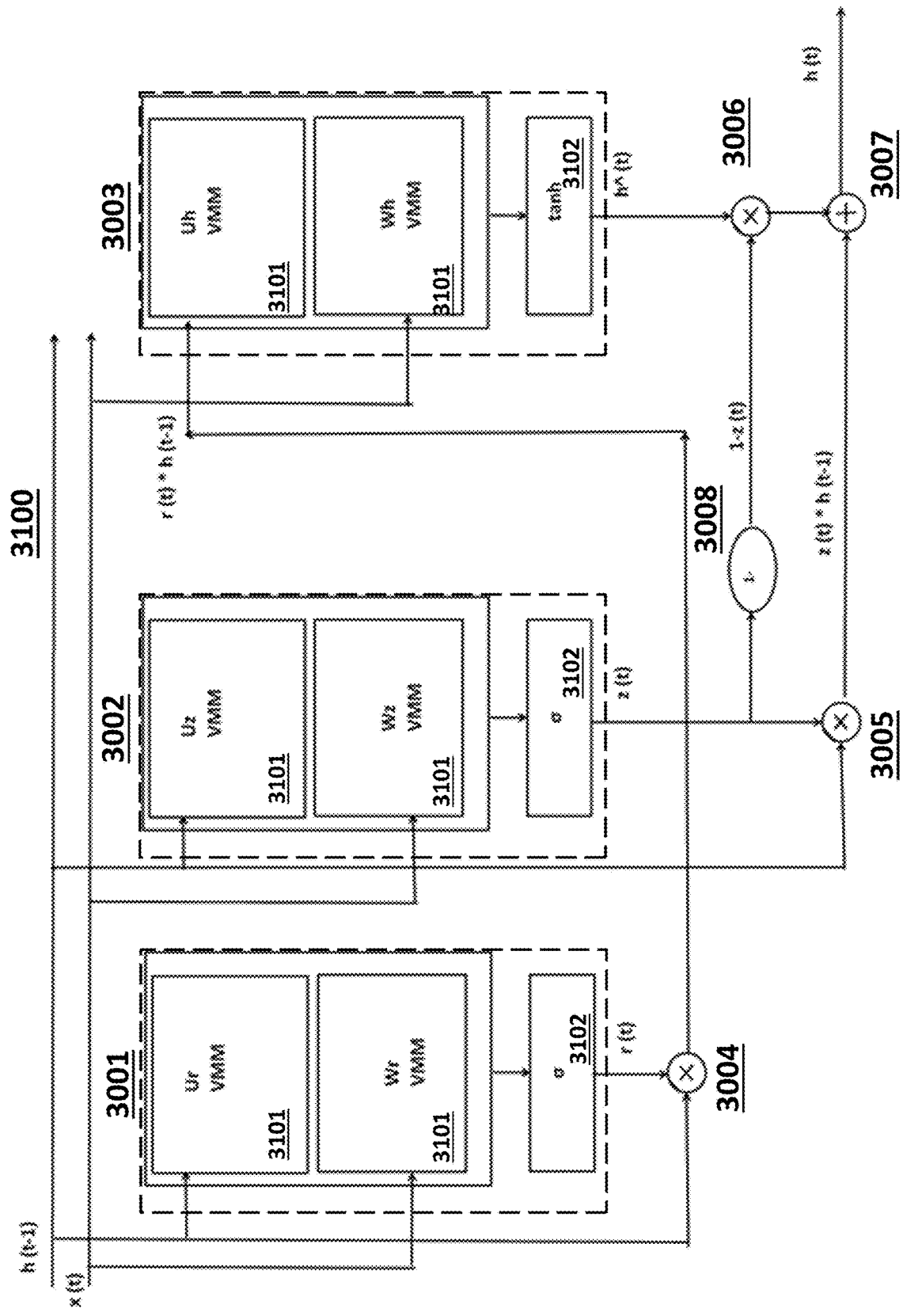
FIG. 31 depicts an embodiment of the exemplary cell of FIG. 30.

FIG. 31 depicts a GRU cell 3100, which is an example of an implementation of GRU cell 3000. For the reader's convenience, the same numbering from GRU cell 3000 is used in GRU cell 3100. As can be seen in FIG. 31, sigmoid function devices 3001 and 3002, and tan h device 3003 each comprise multiple VMM arrays 3101 and activation function blocks 3102. Thus, it can be seen that VMM arrays are of particular use in GRU cells used in certain neural network systems.

Figure 32:
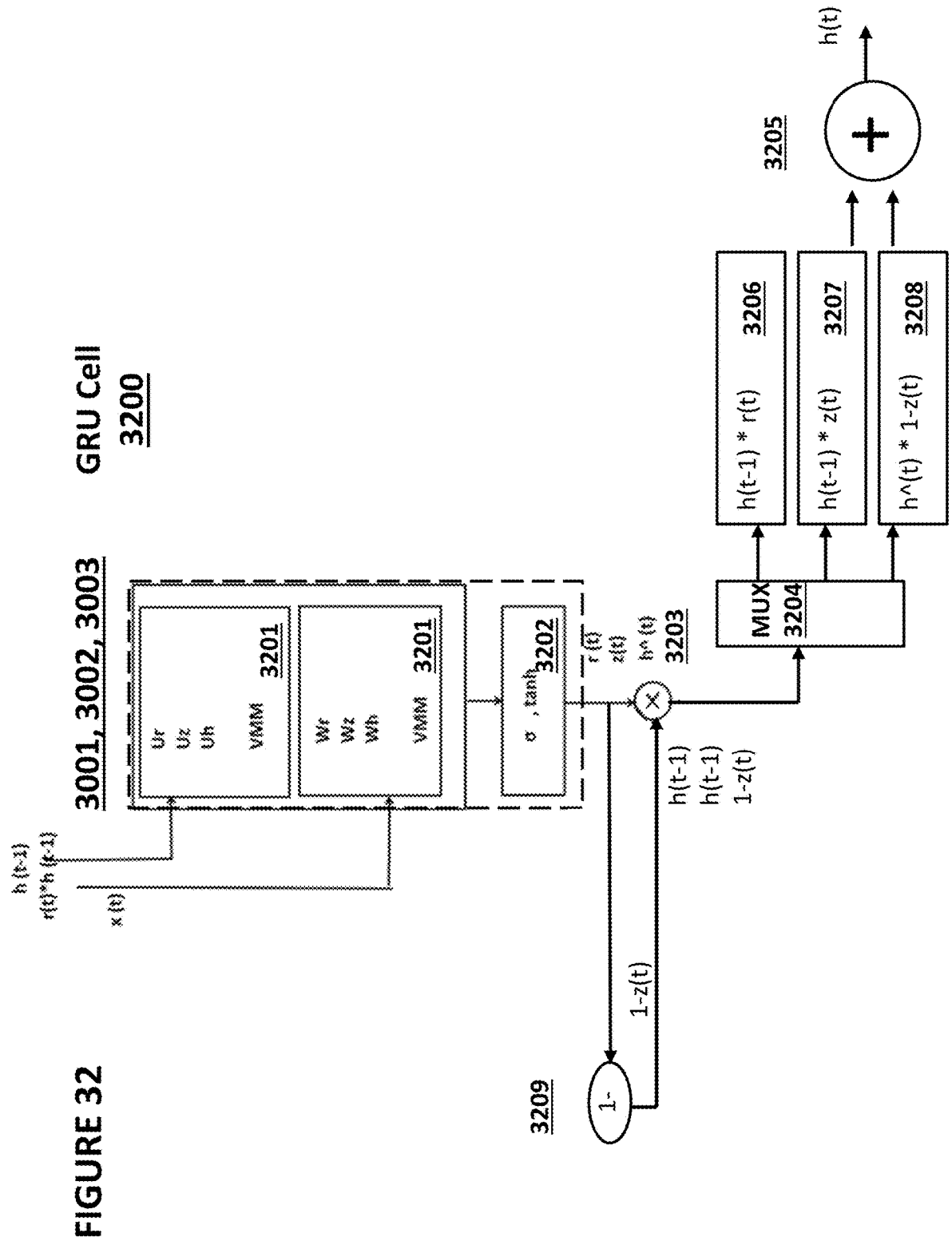
FIG. 32 depicts another embodiment of the exemplary cell of FIG. 30.

An alternative to GRU cell 3100 (and another example of an implementation of GRU cell 3000) is shown in FIG. 32. In FIG. 32, GRU cell 3200 utilizes VMM arrays 3201 and activation function block 3202, which when configured as a sigmoid function applies a number between 0 and 1 to control how much of each component in the input vector is allowed through to the output vector. In FIG. 32, sigmoid function devices 3001 and 3002 and tan h device 3003 share the same physical hardware (VMM arrays 3201 and activation function block 3202) in a time-multiplexed fashion. GRU cell 3200 also comprises multiplier device 3203 to multiply, two vectors together, addition device 3205 to add two vectors together, complementary device 3209 to subtract an input from 1 to generate an output, multiplexor 3204, register 3206 to hold the value h(t−1)*r(t) when that value is output from multiplier device 3203 through multiplexor 3204, register 3207 to hold the value h(t−1)*z(t) when that value is output from multiplier device 3203 through multiplexor 3204, and register 3208 to hold the value h^(t)*(1−z(t)) when that value is output from multiplier device 3203 through multiplexor 3204.

Whereas GRU cell 3100 contains multiple sets of VMM arrays 3101 and activation function blocks 3102, GRU cell 3200 contains only one set of VMM arrays 3201 and activation function block 3202, which are used to represent multiple layers in the embodiment of GRU cell 3200. GRU cell 3200 will require less space than GRU cell 3100, as GRU cell 3200 will require ⅓ as much space for VMMs and activation function blocks compared to GRU cell 3100.

It can be further appreciated that systems utilizing GRUs will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight w can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

Embodiments for Precise Tuning of Cells in a VMM

Figure 33:
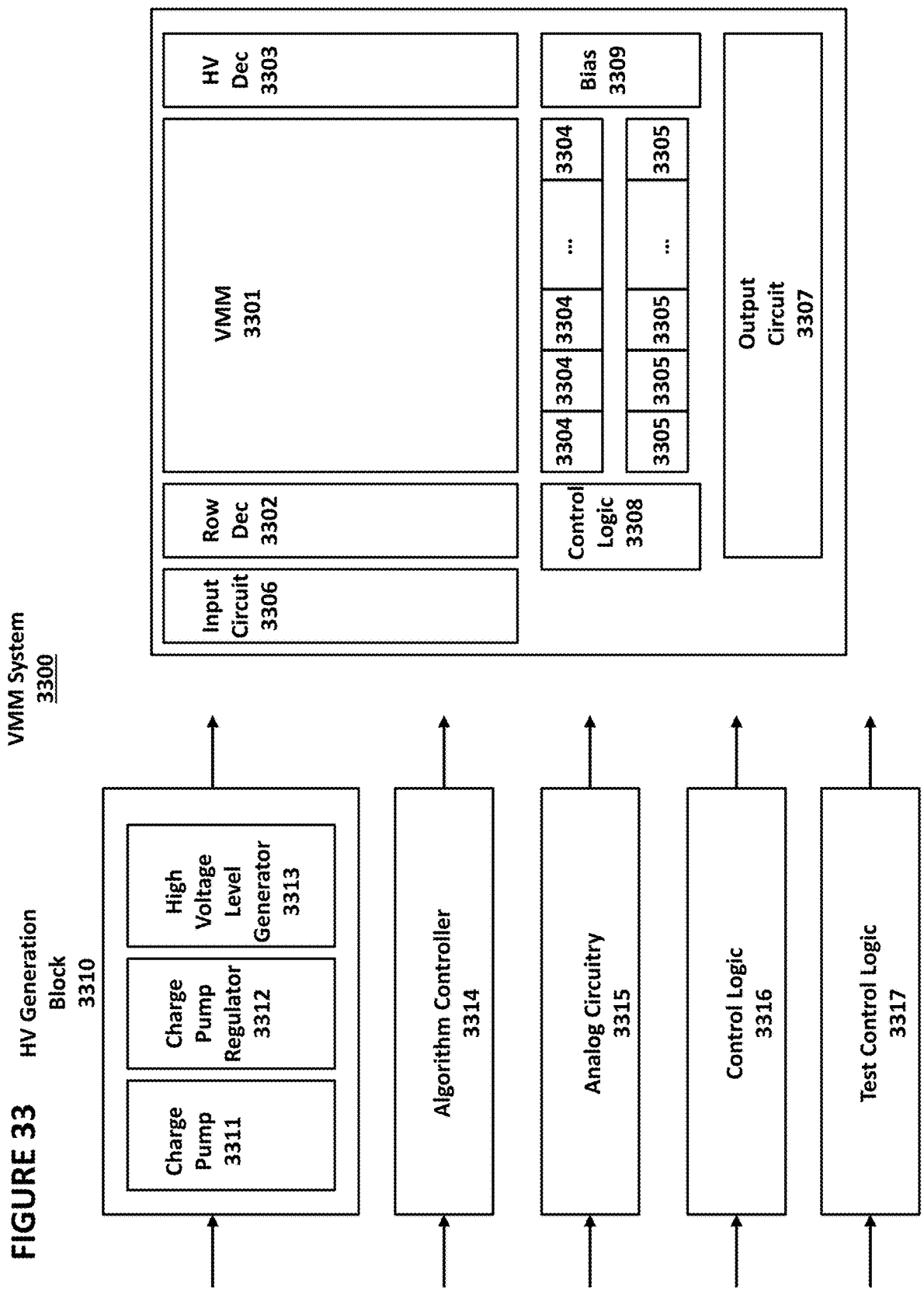
FIG. 33 depicts a VMM system.

FIG. 33 depicts a block diagram of VMM system 3300. VMM system 3300 comprises VMM array 3301, row decoders 3302, high voltage decoders 3303, column decoders 3304, bit line drivers 3305, input circuit 3306, output circuit 3307, control logic 3308, and bias generator 3309. VMM system 3300 further comprises high voltage generation block 3310, which comprises charge pump 3311, charge pump regulator 3312, and high voltage level generator 3313. VMM system 3300 further comprises algorithm controller 3314, analog circuitry 3315, control logic 3316, and test control logic 3317. The systems and methods described below can be implemented in VMM system 3300.

Input circuit 3306 may include circuits such as a DAC (digital to analog converter), DPC (digital to pulses converter), AAC (analog to analog converter, such as current to voltage converter), PAC (pulse to analog level converter), or any other type of converter. Input circuit 3306 may implement normalization, scaling functions, or arithmetic functions. Input circuit 3306 may implement a temperature compensation function for the input. Input circuit 3306 may implement an activation function such as ReLU or a sigmoid function.

Output circuit 3307 may include circuits such as a ADC (analog to digital converter, to convert neuron analog output to digital bits), AAC (analog to analog converter, such as current to voltage converter), APC (analog to pulses converter), or any other type of converter. Output circuit 3307 may implement an activation function such as ReLU or a sigmoid function. Output circuit 3307 may implement normalization, scaling functions, or arithmetic functions for neuron outputs. Output circuit 3307 may implement a temperature compensation function for neuron outputs or array outputs (such as bitline outputs), as described below.

Figure 34:
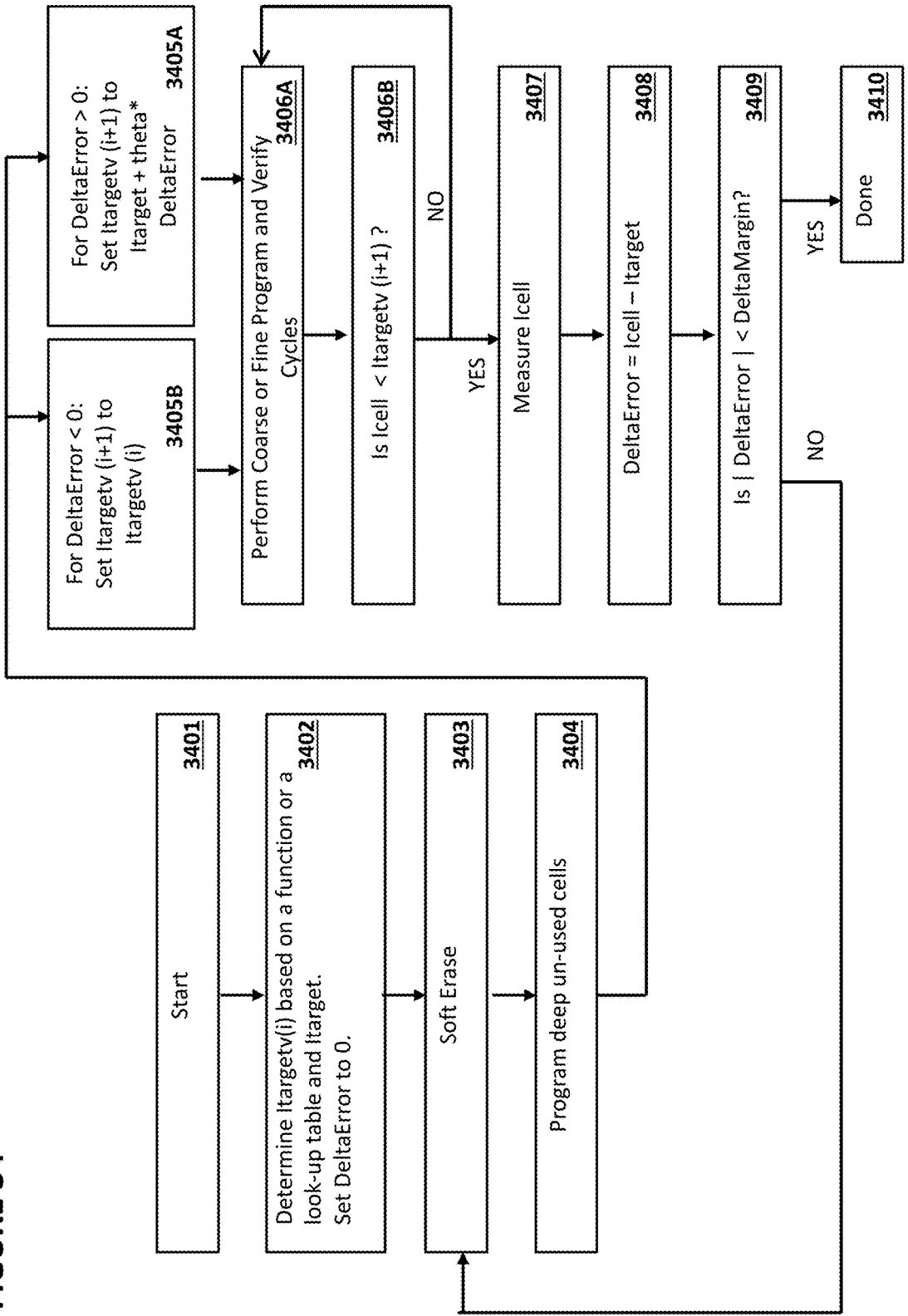
FIG. 34 depicts a tuning correction method.

FIG. 34 depicts tuning correction method 3400, which can be executed by algorithm controller 3314 in VMM system 3300. Tuning correction method 3400 generates an adaptive target based on the final error resulting from a cell output and the cell original target. The method begins, typically in response to a tuning command being received (step 3401). An initial current target (used for a program/verify algorithm) for a selected cell or group of selected cells, Itargetv (i), is determined using a predictive target model such by using a function or a look-up table, and variable DeltaError is set to 0 (step 3402). The target function, if used, would be based upon the I-V program curve of the selected memory cell or group of cells. The target function also depends on various variations that are caused by the array characteristics such as the degree of program disturb that the cell exhibits (which depends on the cell address within a sector and the cell level, where the cell is subjected to more program time in an inhibit condition if it exhibits relatively greater disturb, where cell that has a higher current typically has more disturb), cell to cell coupling, and various types of array noise. These variations can be characterized on the silicon over PVT (process, voltage, temperature). The look-up table, if used, can be characterized in the same manner to emulate the I-V curve and various variations.

Next, a soft erase is performed on all cells in the VMM, which erases all cells to an intermediate weakly erased level such that each cell would draw current of, for example, approximately 3-5 µA during a read operation (step 3403). The soft erase is performed, for example, by applying incremental erase pulse voltages to the cells until an intermediate cell current is reached. Next, a deep programming operation is performed on all unused cells (step 3404) such as to get to <pA current level. Then target adjustment (correction) based on the error result is performed. If DeltaError>0, meaning the cell has undergone an overshoot in programming, Itargetv (i+1) is then set to Itarget+theta*DeltaError, where theta, for example, is 1 or a number close to 1 (step 3405A).

The Itarget (i+1) can also be adjusted basing on the previous Itarget(i) with appropriate error target adjustment/correction. If DeltaError<0, meaning that the cell has undergone an undershoot in programming, meaning the cell current does not reach the target yet, then Itargetv (i+1) is set to the previous target Itargetv (i) (step 3405B).

Next, a coarse and/or fine program and verify operation is performed (step 3406). Multiple adaptive coarse programming methods can be used to speed up the programming such as by targeting multiple gradually smaller coarse targets before executing the precision (fine) programming step. The adaptive precision programming is done, for example, with fine (precision) incremental program voltage pulses or constant program timing pulses. Examples of systems and methods for performing coarse programming and fine programming are described in U.S. Provisional Patent Application No. 62/933,809, filed by the same assignee as the present application on Nov. 11, 2019, and titled, "Precise Programming Method and Apparatus for Analog Neural Memory in a Deep Learning Artificial Neural Network," which is incorporated by reference herein.

Icell is measured in a selected cell (step 3407). The cell current, for example, can be measured by an ammeter circuit. The cell current, for example, can be measured by an ADC (Analog-to-Digital converter) circuit, where in this case the output is represented by digital bits. The cell current, for example, can be measured by an I-to-V (Current-to-Voltage converter) circuit, where in this case the output is represented by an analog voltage. DeltaError is calculated, which is Icell−Itarget, which represents the difference between the actual current in the measured cell (Icell) and the target current (Itarget). If |DeltaError|<DeltaMargin, then the cell has achieved the target current within a certain tolerance (DeltaMargin), and the method is concluded (step 3410). |DeltaError|=abs (DeltaError)=absolute value of DeltaError. If not, then the method returns to step 3403 and performs the steps sequentially again (step 3410).

Figure 35A:
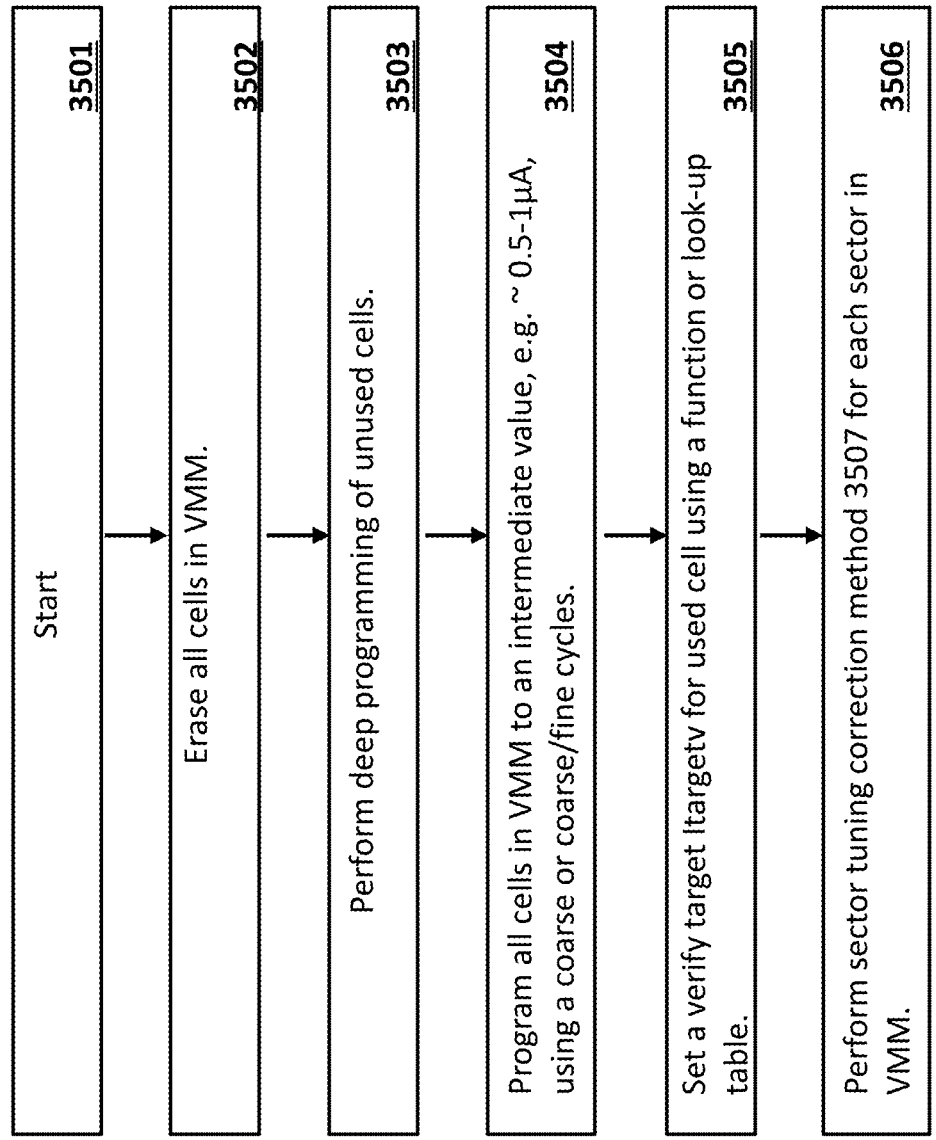
FIG. 35A depicts a tuning correction method.
Figure 35B:
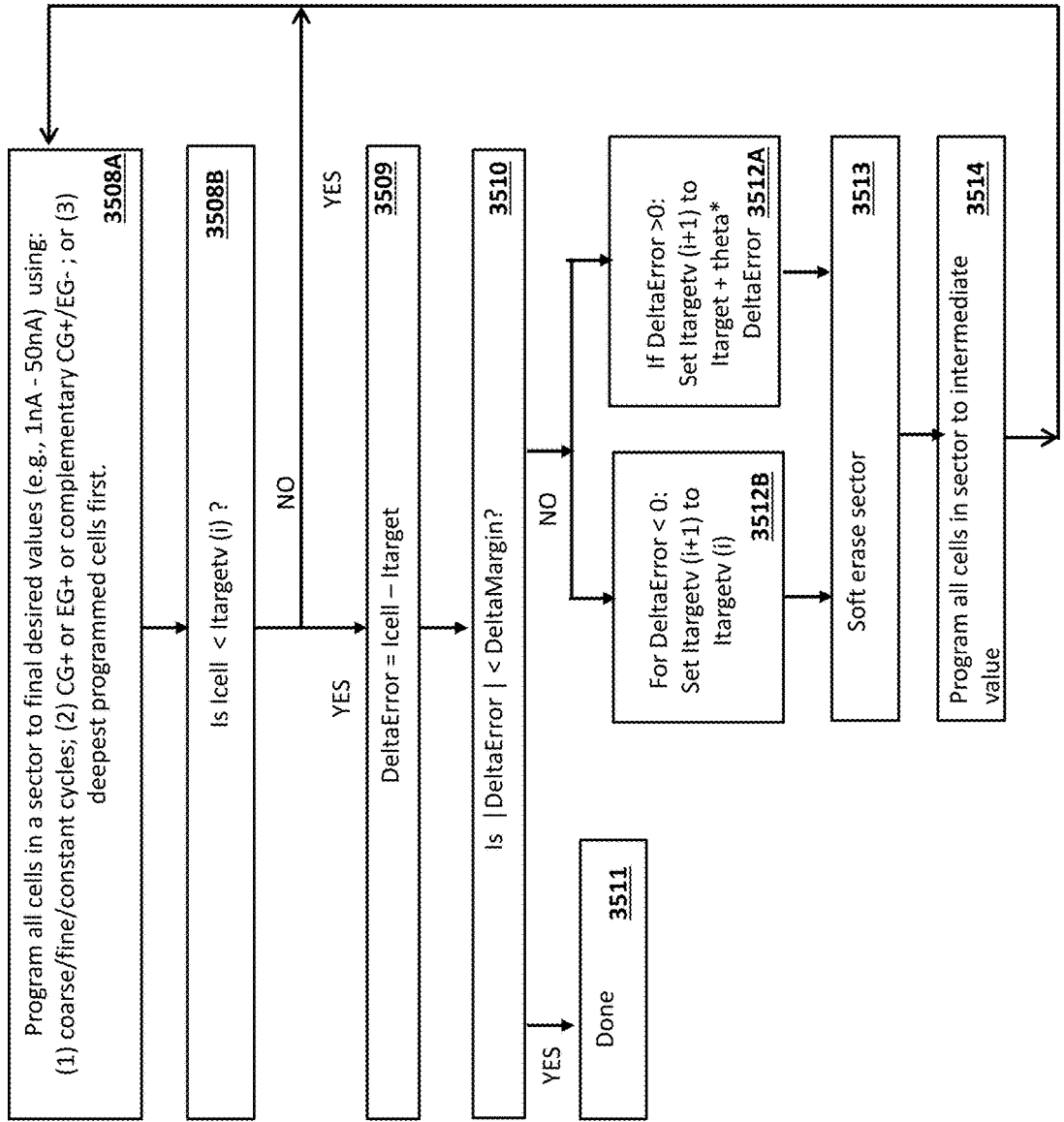
FIG. 35B depicts a sector tuning correction method.

FIGS. 35A and 35B depict tuning correction method 3500, which can be executed by algorithm controller 3314 in VMM system 3300. With reference to FIG. 35A, the method starts (step 3501), which typically occurs in response to a tuning command being received. The entire VMM array is erased such as by a soft erase method (step 3502). A deep programming operation is performed on all unused cells (step 3503) to get cell currents <pA level. All cells in the VMM array are programmed to an intermediate value, such as 0.5-1.0 µA, using a coarse and/or fine programming cycle (step 3504) Examples of systems and methods for performing coarse programming and fine programming are described in U.S. Provisional Patent Application No. 62/933,809, filed by the same assignee as the present application on Nov. 11, 2019, and titled, "Precise Programming Method and Apparatus for Analog Neural Memory in a Deep Learning Artificial Neural Network," which is incorporated by reference herein. A predictive target is set for used cells using a function or look-up table (step 3505) as described above. Next, sector tuning method 3507 is performed for each sector in VMM (step 3506). A sector typically consists of two or more adjacent rows in the array.

FIG. 35B depicts adaptive target sector tuning method 3507. All cells in a sector are programmed to final desired values (e.g., 1 nA-50 nA) using individual or combinations program/verify (P/V) methods such as the following: (1) coarse/fine/constant P/V cycles; (2) CG+ (CG increment only) or EG+ (EG increment only) or complementary CG+/EG− (CG increment and EG decrement); and (3) deepest programmed cells first (such as progressive grouping, meaning grouping cells into groups, groups with cells with lowest current programmed first) (step 3508A). Next, a determination is made as to whether Icell<Itarget. If yes, then the method proceeds to step 3509. If no, then the method repeats step 3508A. In step 3509, DeltaError is measured, which equals Icell measured−Itarget (i+1) (step 3509). A determination is made as to whether |DeltaError|<DeltaMargin (step 3510). If yes, the method is done (step 3511). If not, a target adjustment is performed. If DeltaError>0, meaning the cell has undergone an overshoot in programing, the target is adjusted by setting a new target to Itarget+theta*DeltaError, where theta typically=1 (step 3512A). The Itarget (i+1) can also be adjusted based on previous Itarget(i) with appropriate error target adjustment/correction. If DeltaError<0, meaning the cell has undergone an undershoot in programing, meaning the cell has not reached the target yet, the target is adjusted by keeping the previous target, meaning Itargetv (i+1)=Itargetv (i) (step 3512B). Soft erase sector (step 3513). Program all cells in sector to intermediate value (step 3514), and return to step 3509.

A typical neural network may have positive weight w+ and negative weight w− and a combined weight=w+−w−. w+ and w− are implemented by a memory cell each (Iw+ and Iw− respectively) and the combined weight (Iw=Iw+−Iw−, a current subtraction) can be performed at the peripheral circuit level (such as at array bitline output circuit). Hence, a weight tuning embodiment for the combined weight can comprise tuning both the w+ cell and the w− cell at the same time, tuning the w+ cell only, or tuning the w− cell only as an example as shown in the Table 8. The tuning is performed using the program/verify and error target adjustment methods described previously with respect to FIGS. 34/35A/35B. The verify can be performed for the combined weight only (e.g., measuring/reading the combined weight current but not individual positive w+ cell current or w− cell current, w+ cell current only, or w− cell current only.

For example, for a combined Iw of 3 na, Iw+ can be 3 na and Iw− can be 0na; or, Iw+ can be 13 na and Iw− can be 10 na, meaning both positive weight Iw+ and negative weight Iw− are not zero (e.g., where a zero would signify a deeply programmed cell). This may be preferable in certain operating condition, as it would cause both Iw+ and Iw− to be less susceptible to noise.

TABLE 8

Weight Tuning Method

| | Iw | Iw+ | Iw− | description |
|---|---|---|---|---|
| original target | 3na | 3na | 0na | tune Iw+ and Iw− |
| original target | −2na | 0na | 2na | tune Iw+ and Iw− |
| original target | 3na | 13na | 10na | tune Iw+ and Iw− |
| new target | 2na | 12na | 10na | tune Iw+ only |
| new target | 2na | 11na | 9na | tune Iw+ and Iw− |
| new target | 4na | 13na | 9na | tune Iw− only |
| new target | 4na | 12na | 8na | tune Iw+ and Iw− |
| new target | −2na | 8na | 10na | tune Iw+ and Iw− |
| new target | −2na | 7na | 9na | tune Iw+ and Iw− |

Figure 36C:
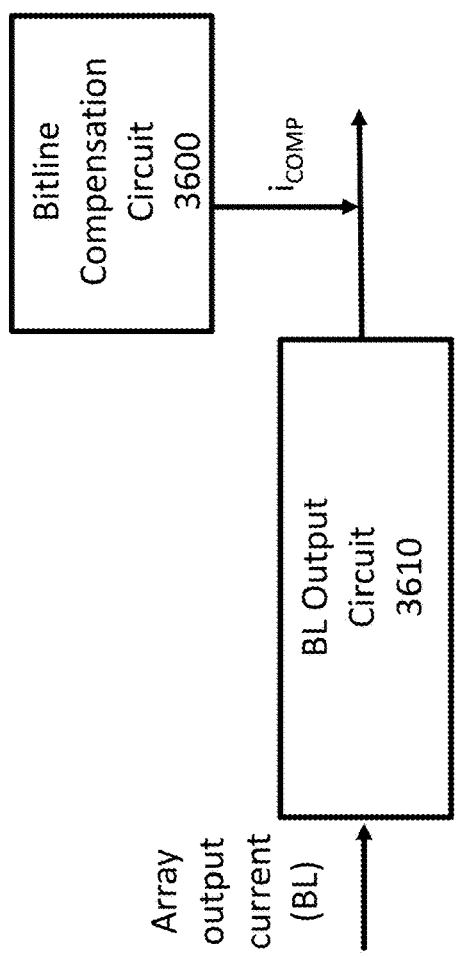
FIG. 36C depicts blocks for compensating for data drift.
Figure 36D:
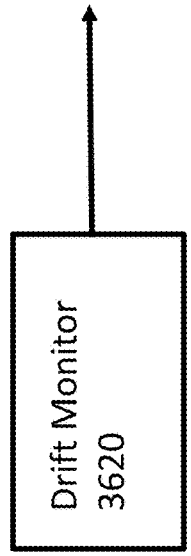
FIG. 36D depicts a data drift monitor.
Figure 36A:
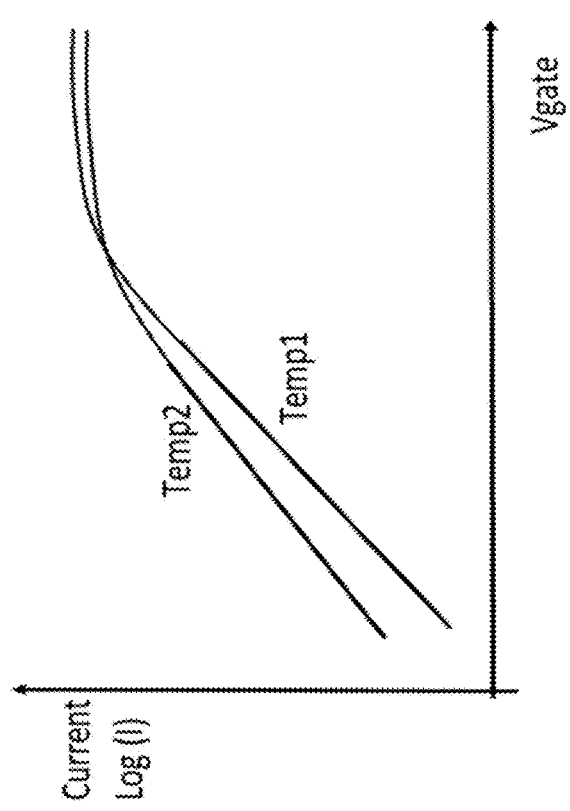
FIG. 36A illustrates the effect of temperature on the value stored in a cell.
Figure 36B:
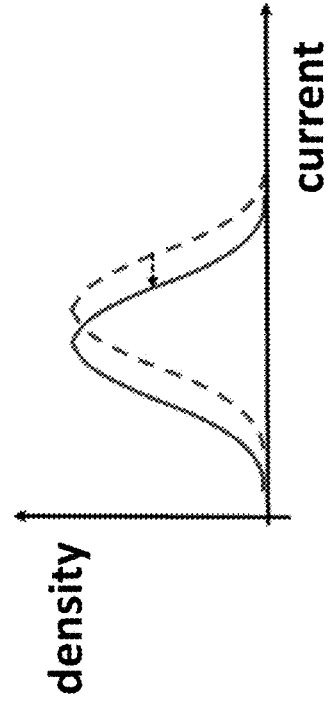
FIG. 36B illustrate the problem created by data drift during operation of a VMM system.

FIG. 36A illustrates the data behavior (I-V curve) over temperature (in subthreshold region as example), FIG. 36B illustrates problems created by data drift during operation of a VMM system, and FIGS. 36C and 36D depict blocks for compensating for data drift and, as to FIG. 36C, for compensating for temperature changes.

FIG. 36A depicts the known characteristic of a VMM system, which is that as operating temperature increases, the sensed current in any given selected non-volatile memory cell in the VMM array increases in the sub-threshold region, decreases in the saturation region, or generally decreases in the linear region.

FIG. 36B shows array current distribution over time usage (data drift), and it shows that the collective output from a VMM array (which is the sum of the current from all bit lines in the VMM array) shifts to the right (or left, depending on the technology utilized) over operating time usage, meaning that the total collective output will drift over lifetime usage of the VMM system. This phenomenon is known as data drift, as the data will drift due to a usage condition and degradation due to an environment factor.

FIG. 36C depicts bitline compensation circuit 3600, which may include injecting a compensation current, $i_{COMP}$, to the output of bitline output circuit 3610 to compensate for data drift. The bitline compensation circuit 3600 may include scaling up or down the output by a scaler circuit based on a resistor or capacitor network. The bitline compensation circuit 3600 may include shifting or offsetting the output by a shifter circuit based on its resistor or capacitor network.

FIG. 36D depicts a data drift monitor 3620, which detects the amount of data drift. That information is then used as an input to bitline compensation circuit 3600 so that the appropriate level of $i_{COMP}$ can be selected.

Figure 37:
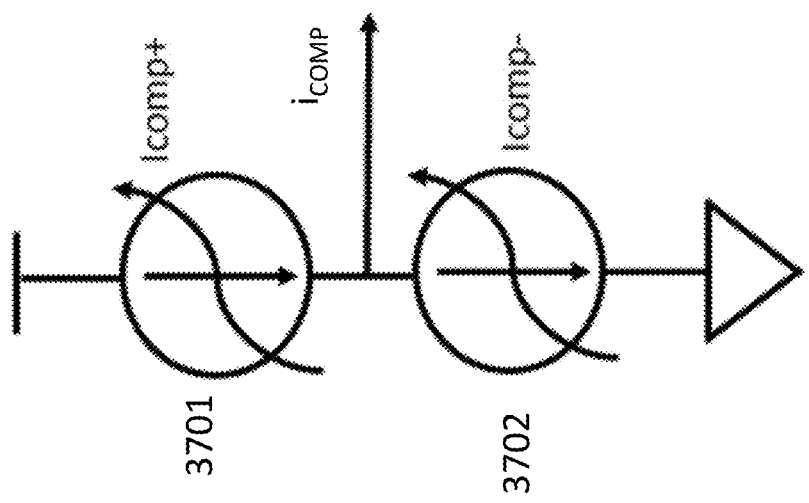
FIG. 37 depicts a bitline compensation circuit.

FIG. 37 depicts bitline compensation circuit 3700, which is an embodiment of bitline compensation circuit 3600 in FIG. 36. Bitline compensation circuit 3700 comprises adjustable current source 3701 and adjustable current source 3702, which together generate $i_{COMP}$, where $i_{COMP}$ is equal to the current generated by adjustable current source 3701 minus the current generated by adjustable current source 3701.

Figure 38:
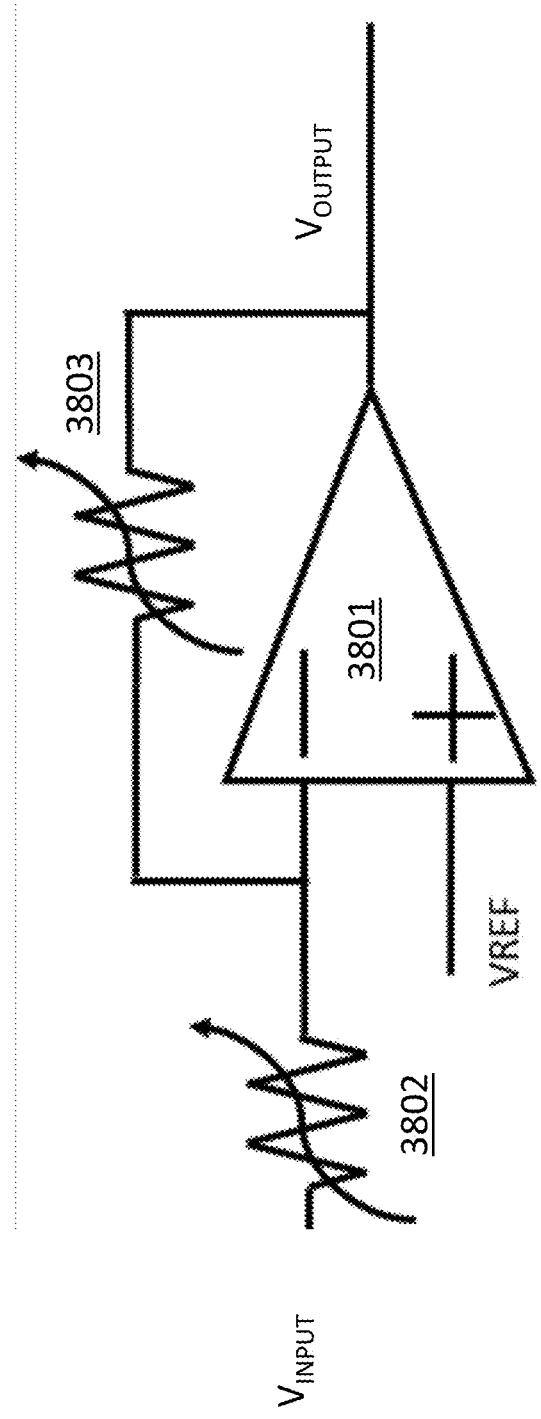
FIG. 38 depicts another bitline compensation circuit.

FIG. 38 depicts bitline compensation circuit 3700, which is an embodiment of bitline compensation circuit 3600 in FIG. 36. Bitline compensation circuit 3800 comprises operational amplifier 3801, adjustable resistor 3802, and adjustable resistor 3803. Operational amplifier 3801 receives a reference voltage, VREF, on its non-inverting terminal and $V_{INPUT}$ on its inverting terminal, where $V_{INPUT}$ is the voltage received from bitline output circuit 3610 in FIG. 36C, and generates an output of $V_{OUTPUT}$, where $V_{OUTPUT}$ is a scaled version of $V_{INPUT}$ to compensate for data drift basing the ratio of the resistor 3803 and 3802. By configuring the value of the resistor 3803 and/or 3802, $V_{OUTPUT}$ can be scaled up or down.

Figure 39:
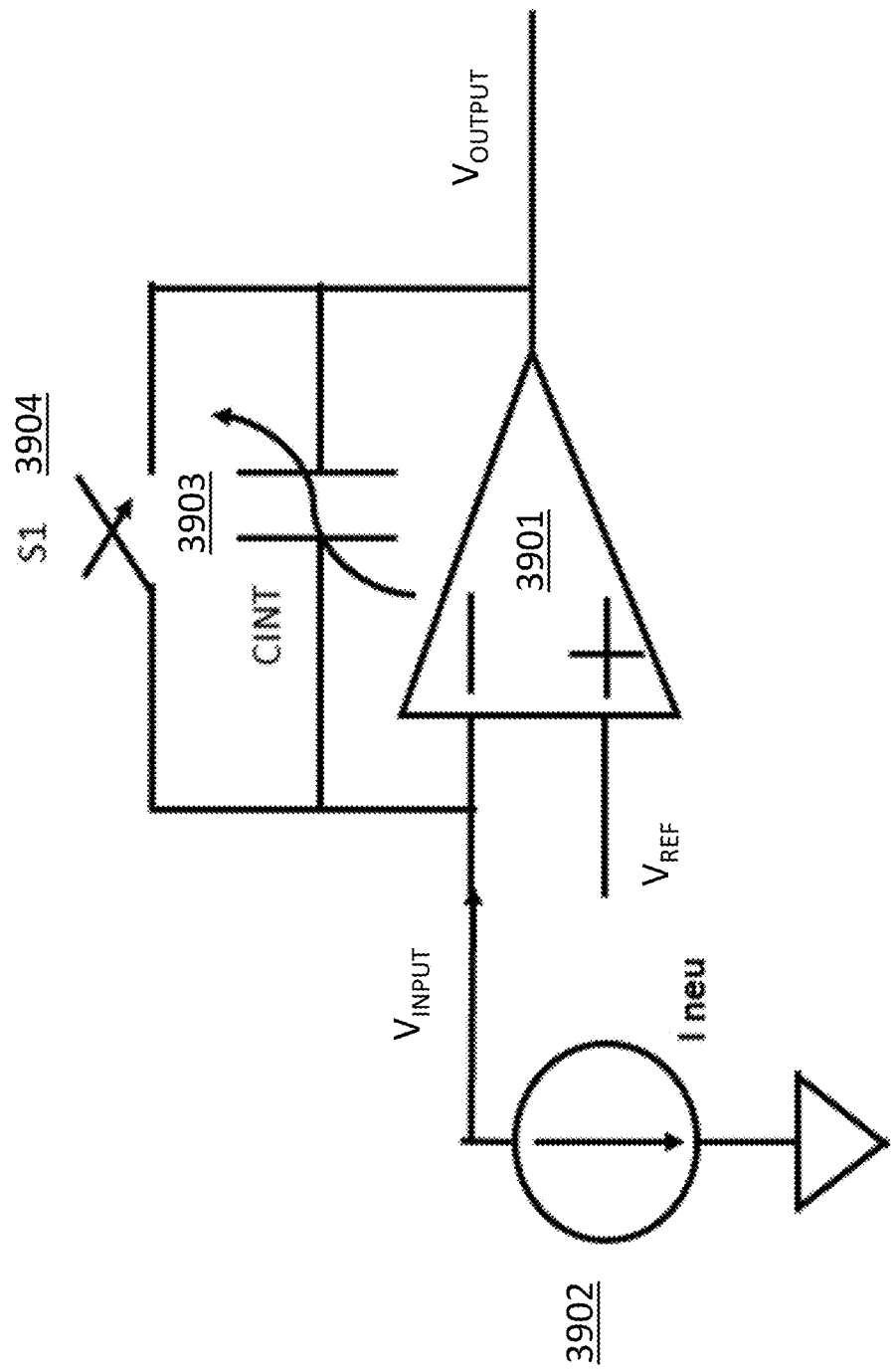
FIG. 39 depicts another bitline compensation circuit.

FIG. 39 depicts bitline compensation circuit 3900, which is an embodiment of bitline compensation circuit 3600 in FIG. 36. Bitline compensation circuit 3900 comprises operational amplifier 3901, current source 3902, switch 3904, and adjustable integrating output capacitor 3903. Here, current source 3902 actually is the output current on a single bitline or the collection of multiple of bitlines (such as one for summing positive weights, w+, and one for summing negative weights, w−) in the VMM array. Operational amplifier 3901 receives a reference voltage, VREF, on its non-inverting terminal and $V_{INPUT}$ on its inverting terminal, where $V_{INPUT}$ is the voltage received from bitline output circuit 3610 in FIG. 36C. Bitline compensation circuit 3900 acts as an integrator, which integrates the current Ineu across the capacitor 3903 in an adjustable integration time to generate an output voltage $V_{OUTPUT}$, where $V_{OUTPUT}$=Ineu*integration time/$C_{3903}$, where $C_{3903}$ is value of the capacitor 3903. Hence, the output voltage $V_{OUTPUT}$ is proportional to the (bitline) output current Ineu, proportional to the integration time. and inversely proportional to the capacitance of capacitor 3903. Bitline compensation circuit 3900 generates an output of $V_{OUTPUT}$, where the value of the $V_{OUTPUT}$ is scaled based on the configured value of the capacitor 3903 and/or the integration time to compensate for data drift.

Figure 40:
FIG. 40 depicts another bitline compensation circuit.

FIG. 40 depicts bitline compensation circuit 4000, which is an embodiment of bitline compensation circuit 3600 in FIG. 36. Bitline compensation circuit 4000 comprises current mirror 4010 with an M:N ratio, meaning the $I_{COMP}$=(M/N)*$i_{input}$ Current mirror 4010 receives current $i_{INPUT}$ and mirrors that current and optionally scales that current to generate $i_{COMP}$. Hence, by configuring the M and/or N parameters, $i_{COMP}$ can be scaled upward or downward.

Figure 41:
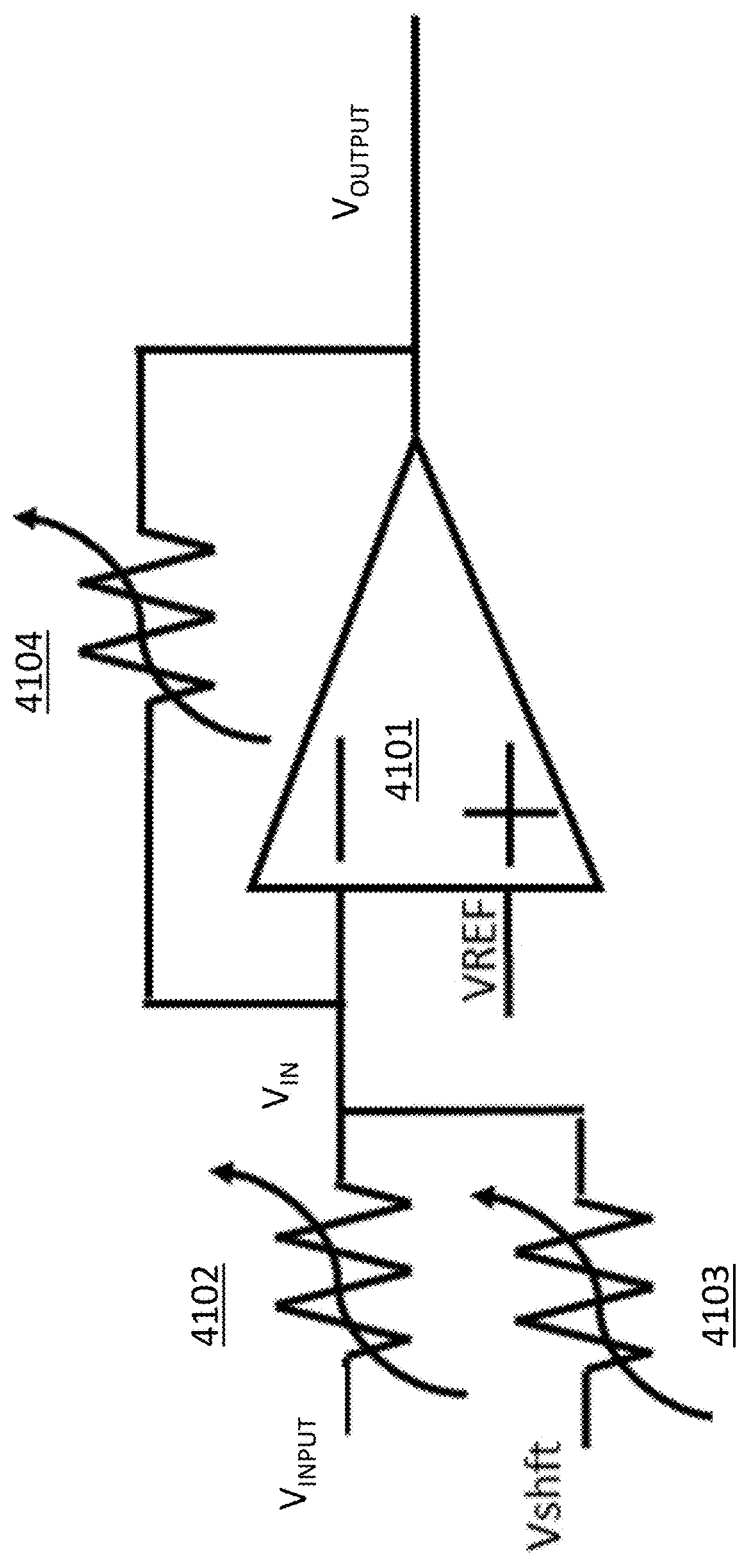
FIG. 41 depicts another bitline compensation circuit.

FIG. 41 depicts bitline compensation circuit 4100, which is an embodiment of bitline compensation circuit 3600 in FIG. 36. Bitline compensation circuit 4100 comprises operational amplifier 4101, adjustable scaling resistor 4102, adjustable shifting resistor 4103, and adjustable resistor 4104. Operational amplifier 4101 receives a reference voltage, $V_{REF}$, on its non-inverting terminal and VIN on its inverting terminal. $V_{IN}$ is generated in response to $V_{INPUT}$ and Vshft, where $V_{INPUT}$ is the voltage received from bitline output circuit 3610 in FIG. 36C and Vshft is a voltage intended to implement a shift between $V_{INPUT}$ and $V_{OUTPUT}$. Thus, $V_{OUTPUT}$ is a scaled and shifted version of $V_{INPUT}$ to compensate for data drift.

Figure 42:
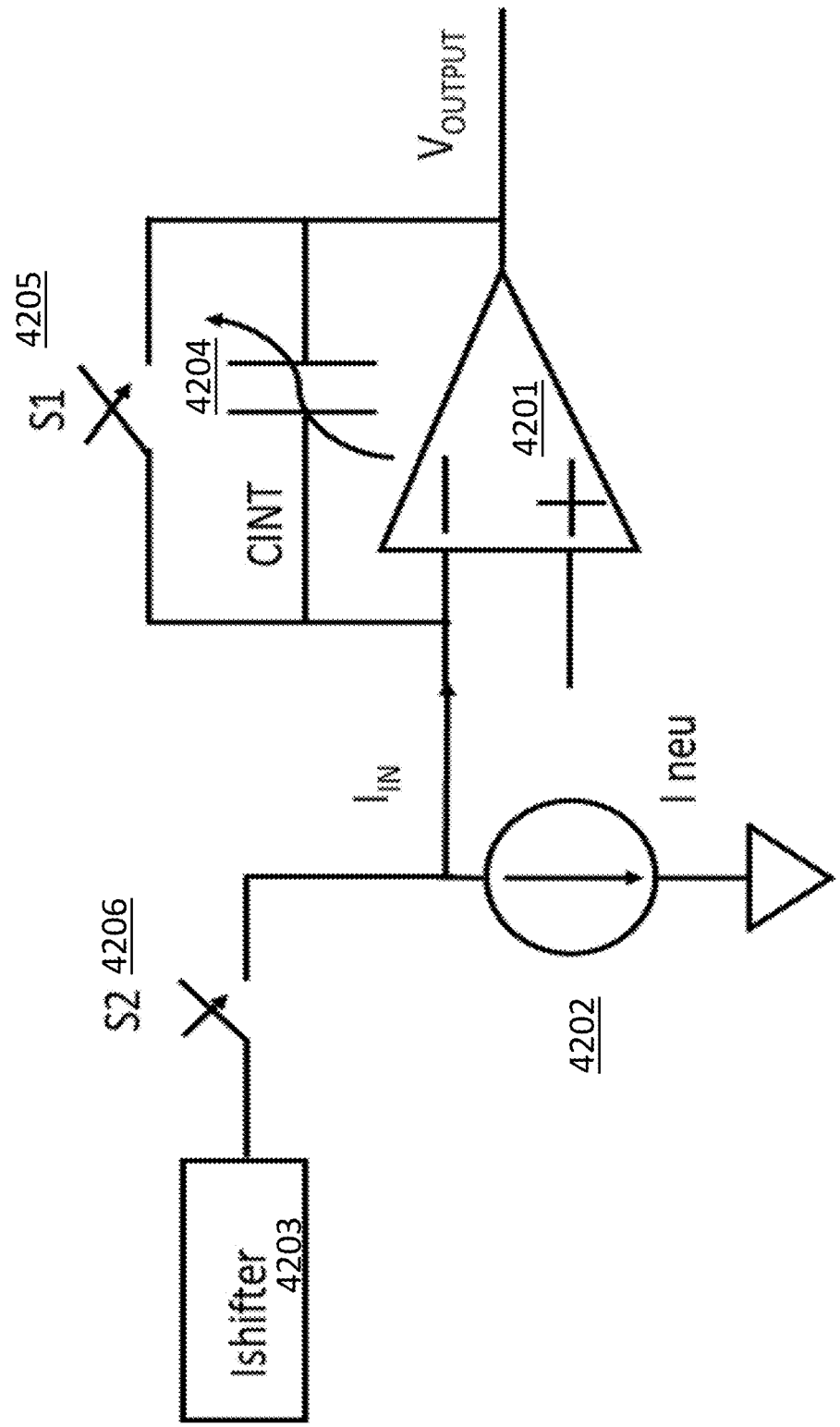
FIG. 42 depicts another bitline compensation circuit.

FIG. 42 depicts bitline compensation circuit 4200, which is an embodiment of bitline compensation circuit 3600 in FIG. 36. Bitline compensation circuit 4200 comprises operational amplifier 4201, input current source Ineu 4202, current shifter 4203, switches 4205 and 4206 and adjustable integrating output capacitor 4204. Here, current source 4202 actually is the output current, Ineu, on a single bitline or the multiple bitlines in the VMM array. Operational amplifier 4201 receives a reference voltage, VREF, on its non-inverting terminal and $I_{IN}$ on its inverting terminal, where $I_{IN}$ is the sum of Ineu and a current output by current shifter 4203, and generates an output of $V_{OUTPUT}$, where $V_{OUTPUT}$ is scaled (basing on the capacitor 4204) and shifted (basing on Ishifter 4203) to compensate for data drift.

FIGS. 43-48 depict various circuits that can be used to provide the W value to be programmed or read into each selected cell during a programming or reading operation.

Figure 43:
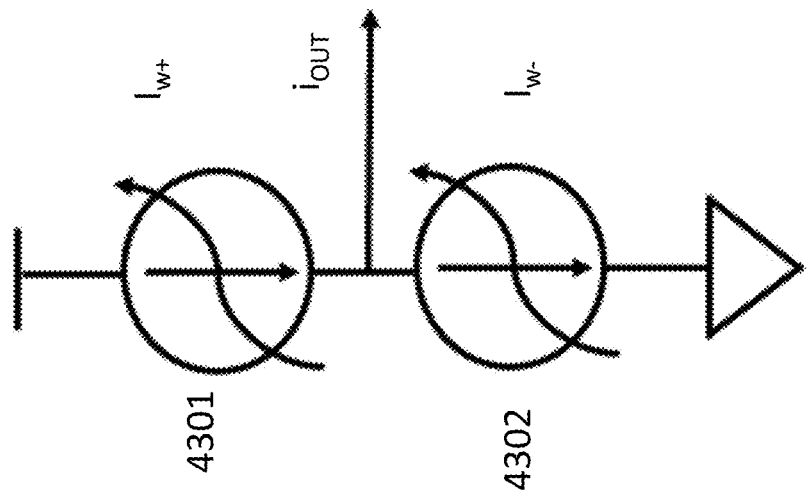
FIG. 43 depicts a neuron circuit.

FIG. 43 depicts neuron output circuit 4300, which comprises adjustable current source 4301 and adjustable current source 4302, which together generate $I_{OUT}$, where $I_{OUT}$ is equal to the current generated by adjustable current source 4301, $I_{W+}$, minus the current generated by adjustable current source 4302, $I_{W-}$. The adjustable current Iw+ 4301 is a scaled current of the cell current or neuron current (such as bitline current) to implement positive weight. The adjustable current Iw− 4302 is a scaled current of the cell current or neuron current (such as bitline current) to implement negative weight. The current scaling is done such as by a M:N ratio current mirror circuit, Iout=(M/N)*Iin.

Figure 44:
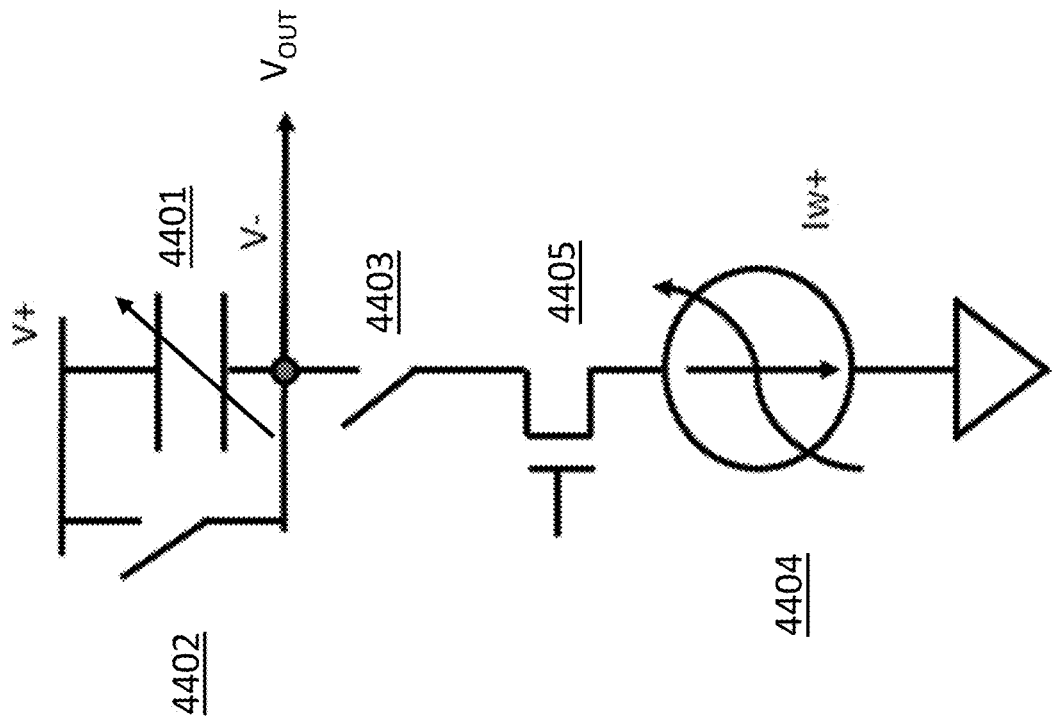
FIG. 44 depicts another neuron circuit.

FIG. 44 depicts neuron output circuit 4400, which comprises adjustable capacitor 4401, control transistor 4405, switch 4402, switch 4403, and adjustable current source 4404 Iw+, which is a scaled output current of the cell current or (bitline) neuron current such as by a M:N current mirror circuit. The transistor 4405 is used for example to impose a fixed bias voltage on the current 4404. The circuit 4404 generates $V_{OUT}$, where $V_{OUT}$ is inversely proportional to the capacitor 4401, proportional to an adjustable integration time (time switch 4403 closed and the switch 4402 opened) and proportional to the current generated by adjustable current source 4404, $I_{W+}$. $V_{OUT}$ is equal to V+− ((Iw+*integration time)/$C_{4401}$), where C4401 is value of the capacitor 4401. The positive terminal, V+, of the capacitor 4401 is connected to a positive supply voltage and the negative terminal, V−, of the capacitor 4401 is connected to the output voltage VOUT.

Figure 45:
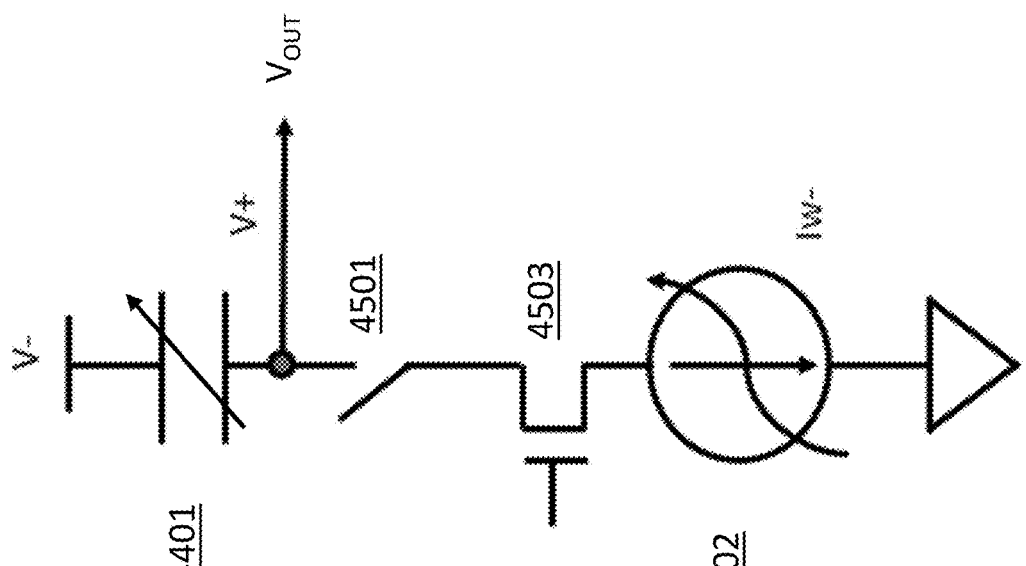
FIG. 45 depicts another neuron circuit.

FIG. 45 depicts neuron circuit 4500, which comprises capacitor 4401 and adjustable current source 4502, which is a scaled current of cell current or (bitline) neuron current such as by a M:N current mirror. The circuit 4500 generates $V_{OUT}$, where $V_{OUT}$ is inversely proportional to the capacitor 4401, proportional to an adjustable integration time (time the switch 4501 opened) and proportional to the current generated by adjustable current source 4502, $I_{Wi}$. The capacitor 4401 is re-used from the neuron output circuit 44 after it completes its operation of integrating the current Iw+. Then the positive and negative terminals (V+ and V−) are exchanged in the neuron output circuit 45, in which the positive terminal is connected to the output voltage $V_{OUT}$, which is de-integrated by the current Iw−. The negative terminal is held at the previous voltage value by a clamp circuit (not shown). In effect, the output circuit 44 is used for positive weight implementation and the circuit 45 is used for negative weight implementation with the final charge on the capacitor 4401 representing the combined weight (Qw=Qw+−Qw−) effectively).

Figure 46:
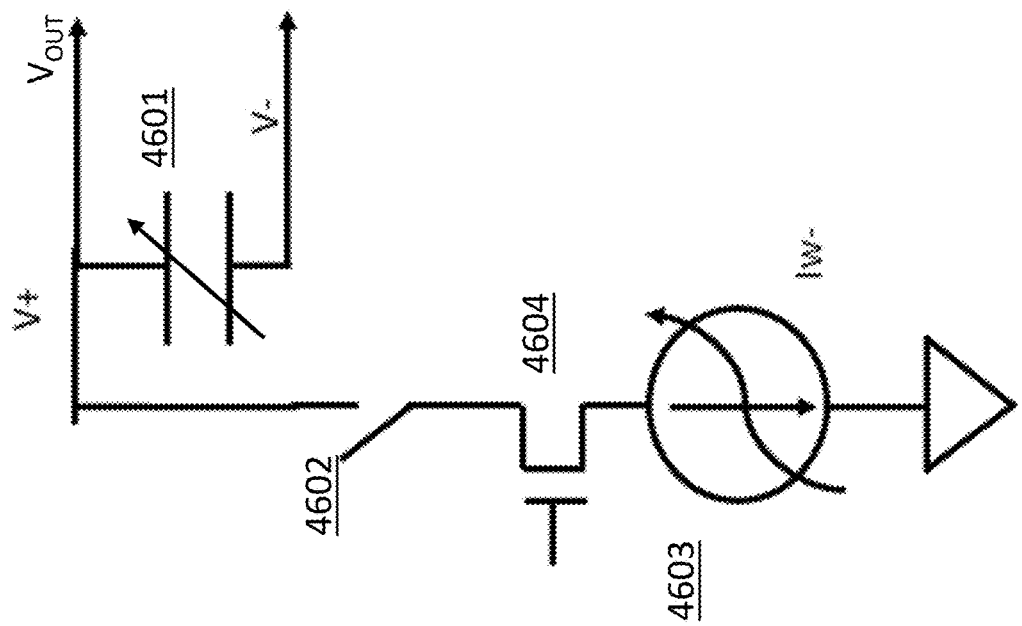
FIG. 46 depicts another neuron circuit.

FIG. 46 depicts neuron circuit 4600, which comprises adjustable capacitor 4601, switch 4602, control transistor 4604, and adjustable current source 4603. The circuit 4600 generates $V_{OUT}$, where $V_{OUT}$ is inversely proportional to the capacitor 4601, proportional to an adjustable integration time (time the switch 4602 opened), and proportional to the current generated by adjustable current source 4603, $I_{W-}$. The negative terminal V− of the capacitor 4601 is, for example, equal to ground. The positive terminal V+ of the capacitor 4601 is, for example, initially pre-charged to a positive voltage before integrating the current Iw−. The neuron circuit 4600 can be used in place of the neuron circuit 4500 together with the neuron circuit 4400 to implement the combined weight (Qw=Qw+−Qw−).

Figure 47:
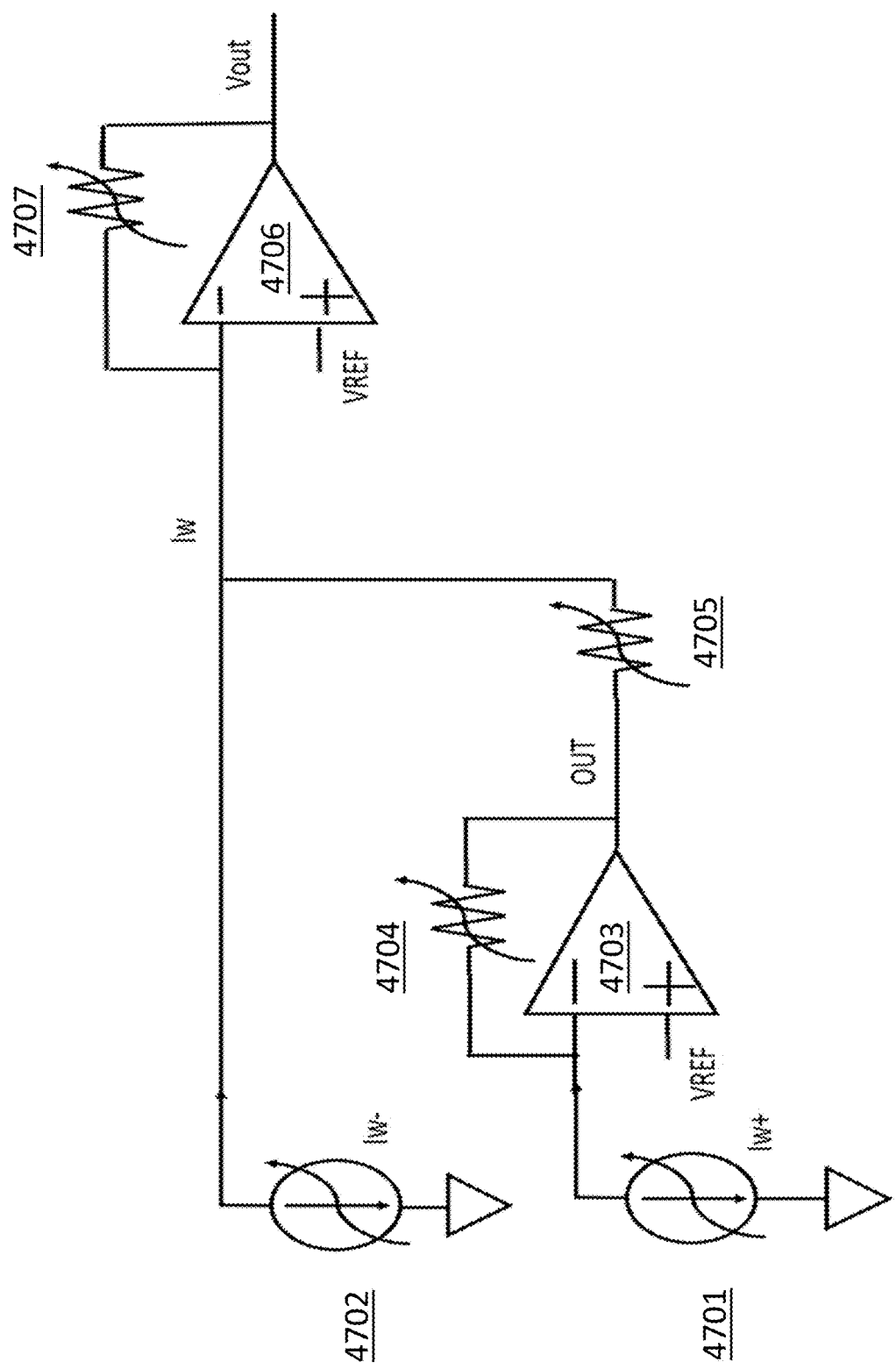
FIG. 47 depicts another neuron circuit.

FIG. 47 depicts neuron circuit 4700, which comprises operational amplifiers 4703 and 4706; adjustable current sources Iw+ 4701 and Iw− 4702; and adjustable resistors 4704, 4705, and 4707. Neuron circuit 4700 generates $V_{OUT}$, which is equal to $R_{4707}*(Iw+-Iw-)$. The adjustable resistor 4707 implements the scaling of the output. The adjustable current sources Iw+ 4701 and Iw− 4702 also implement the scaling of the output such as by a M:N ratio current mirror circuit (Iout=(M/N)*Iin).

Figure 48:
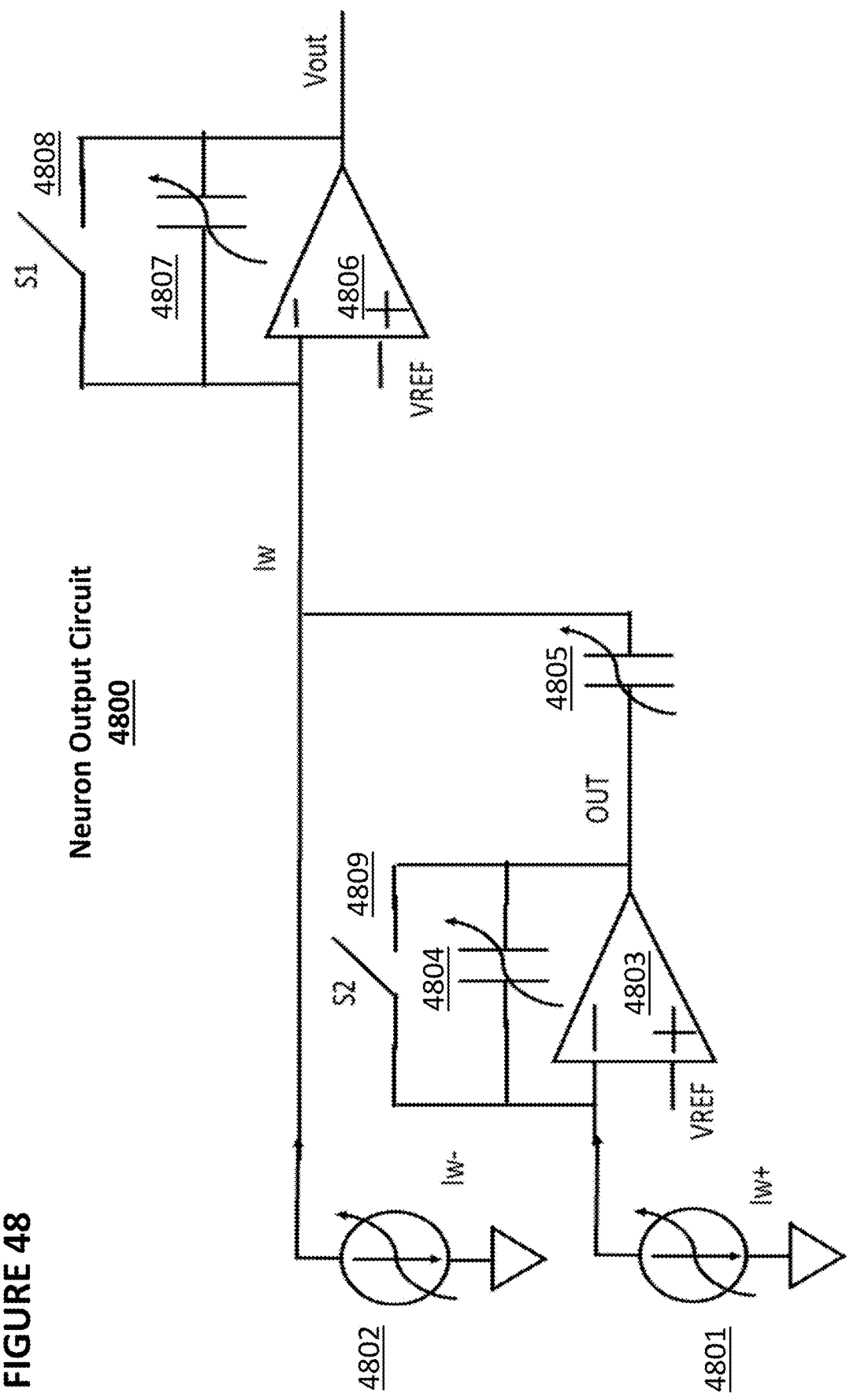
FIG. 48 depicts another neuron circuit.

FIG. 48 depicts neuron circuit 4800, which comprises operational amplifiers 4803 and 4806; switches 4808 and 4809; adjustable current sources Iw− 4802 and Iw+ 4801; adjustable capacitors 4804, 4805, and 4807. Neuron circuit 4800 generates $V_{OUT}$, which is proportional to (Iw+−Iw−), proportional to an integration time (time switches 4808 and 4809 opened), and inversely proportional to the capacitance of capacitor 4807. The adjustable capacitor 4807 implements the scaling of the output. The adjustable current source Iw+ 4801 and Iw− 4802 also implement the scaling of the output such as by a M:N ratio current mirror circuit (Iout=(M/N)*Iin). The integration time can also adjust the output scaling.

Figure 49A:
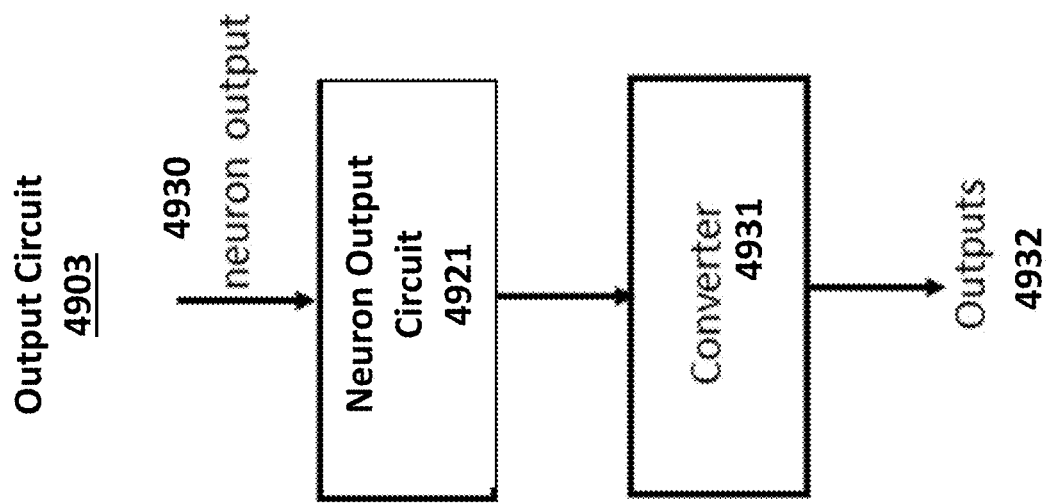
FIG. 49A depicts a block diagram of an output circuit.
Figure 49B:
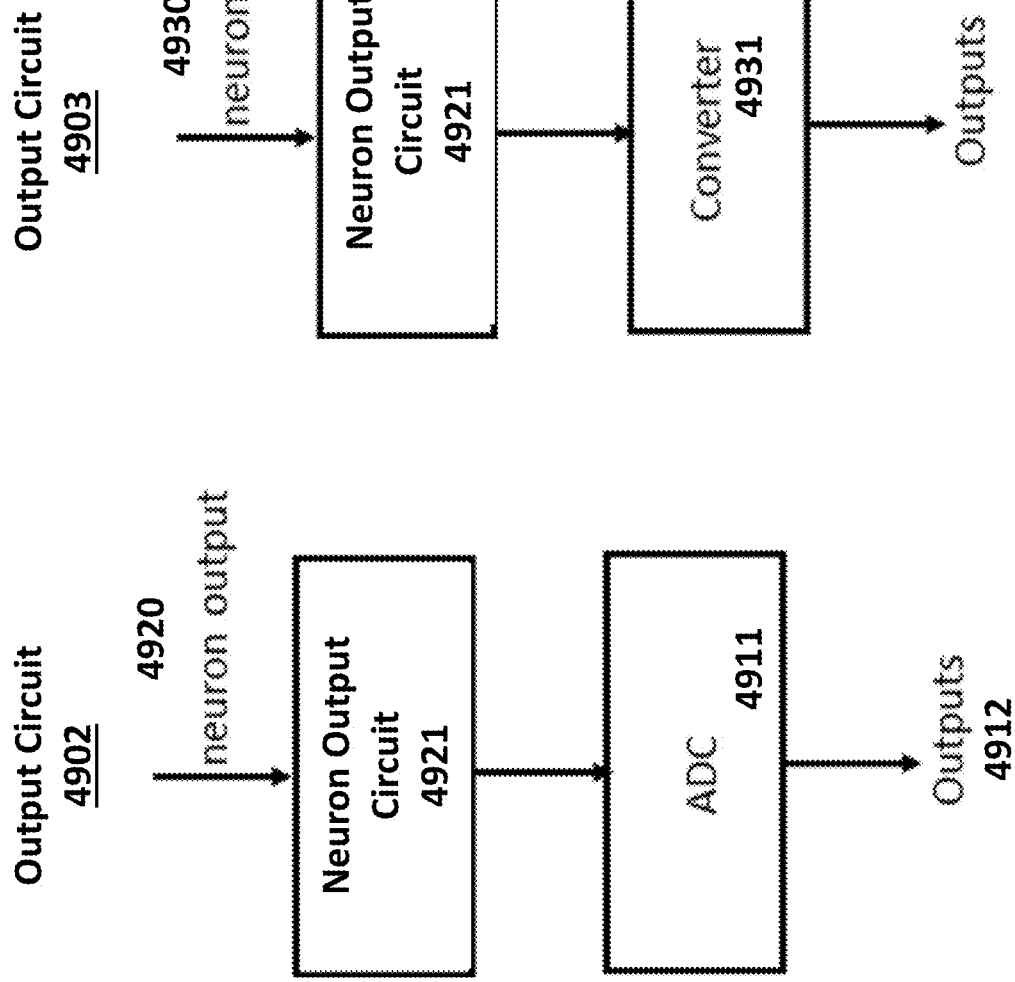
FIG. 49B depicts a block diagram of another output circuit.
Figure 49C:
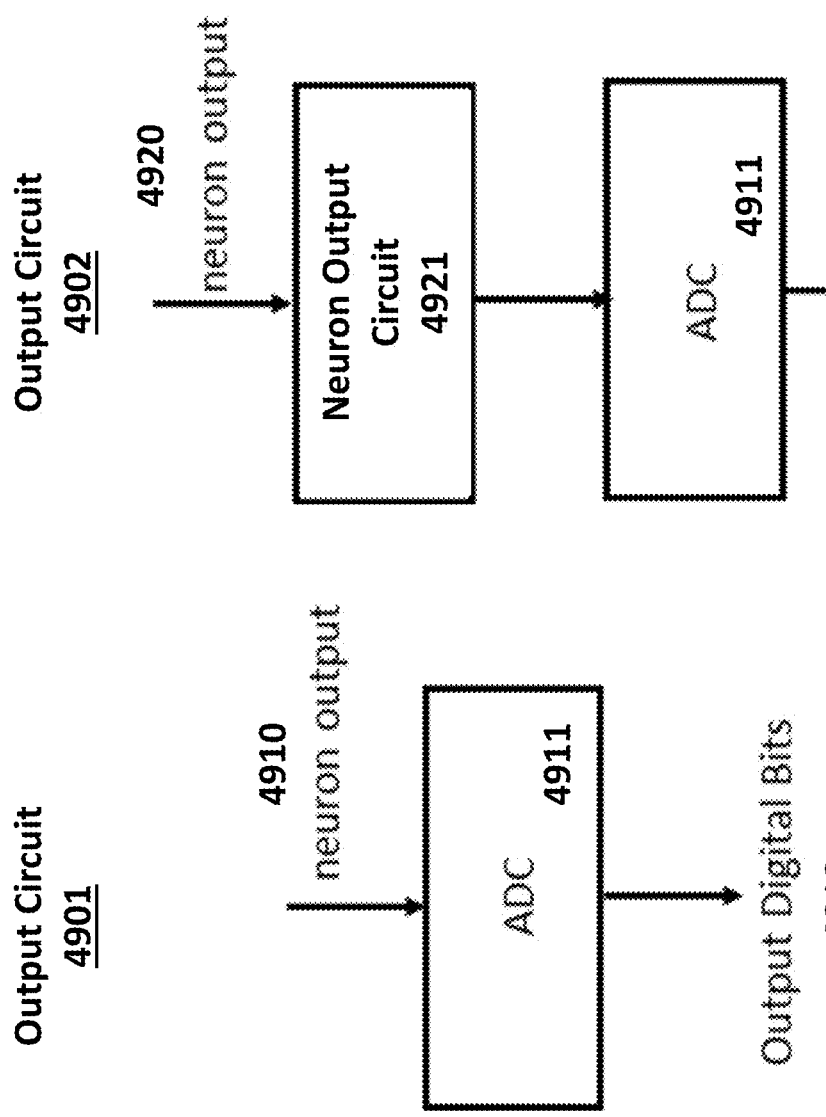
FIG. 49C depicts a block diagram of another output circuit.

FIGS. 49A, 49B, and 49C depict block diagrams of an output circuit such as output circuit 3307 in FIG. 33.

In FIG. 49A, output circuit 4901 comprises ADC circuit 4911, which is used to digitize analog neuron output 4910 directly to provide digital output bits 4912.

In FIG. 49B, output circuit 4902 comprises neuron output circuit 4921 and ADC 4911. Neuron output circuit 4921 receives neuron output 4920 and shapes it before being digitized by the ADC circuit 4911 to generate outputs 4912. Neuron Output circuit 4921 can be used for normalization, scaling, shifting, mapping, arithmetic operations, activation, and/or temperature compensation such as described previously. ADC circuit can be serial (sloped or ramp or counting) ADC, SAR ADC, piped line ADC, Sigma Delta ADC, or any type of ADC.

In FIG. 49C, output circuit comprises neuron output circuit 4921, which receives neuron output 4930, and converter circuit 4931 is for converting output from neuron output circuit 4921 into output 4932. Converter 4931 can comprise an ADC, AAC (analog to analog converter, such as current to voltage converter), APC (analog to pulses converter), or any other type of converter. ADC 4911 or converter 4931 can be used to implement an activation function by for example bit mapping (e.g., quantization) or clipping (e.g., clipped ReLU). ADC 4911 and converter 4931 can be configurable such as for lower or higher precision (e.g., lower or higher number of bits), lower or higher performance (e.g., slower or faster speed), etc.

Another embodiment for scaling and shifting is by configuring ADC (Analog-to-Digital) conversion circuits (such as serial ADC, SAR ADC, piped-line ADC, slope ADC, etc.) that are used to convert the array (bitline) output to digital bits such as having less or more bit precision and then manipulating the digital output bits, such as through normalization (e.g., 12-bit to 8-bit), shifting, or re-mapping according to a certain function (e.g., linear or non-linear, compression, non-linear activations, etc.). Examples of ADC conversion circuits are described in U.S. Provisional Patent Application No. 62/933,809, filed by the same assignee as the present application on Nov. 11, 2019, and titled, "Precise Programming Method and Apparatus for Analog Neural Memory in a Deep Learning Artificial Neural Network," which is incorporated by reference herein.

Table No. 9 depicts an alternative approach to performing read, erase, and program operations:

TABLE NO. 9

Operation of Flash Memory Cells

| | SL | BL | WL | CG | EG | P-Sub |
|---|---|---|---|---|---|---|
| Read | 0 | 0.5 | 1 | 0 | 0 | 0 |
| Erase | 0 | 0 | 0 | 0/−8 V | 10-12 V/+8 V | 0 |
| Program1 | 0-5 V | 0 | 0 | 8 V | −10 to −12 V | 0 |
| Program2 | 0 | 0 | 0 | 8 V | 0-5 V | −10 V |

The read and erase operation are similar to previous tables. The two methods for programming are however implemented by Fowler-Nordheim (FN) tunneling mechanism.

An embodiment for scaling on the input can be done such as by enabling a certain number of rows of the VMM at a time, then combines the results altogether.

Another embodiment is scaling the input voltage, and appropriately re-scaling the output for normalization.

Another embodiment for scaling pulsewidth modulation input is by modulating timing of the pulsewidth. An example of this technique is described in U.S. patent application Ser. No. 16/449,201, filed by the same assignee as the present application on Jun. 21, 2019, and titled, "Configurable Input Blocks and Output Blocks and Physical Layout for Analog Neural Memory in Deep Learning Artificial Neural Network," which is incorporated by reference herein.

Another embodiment for scaling the input is by enabling an input binary bit one at a time, for example, for 8-bit input IN7:0, evaluate IN0, IN1, ..., IN7 respectively in sequential order, then combine the output results together with appropriate binary bit weighting. An example of this technique is described in U.S. patent application Ser. No. 16/449,201, filed by the same assignee as the present application on Jun. 21, 2019, and titled, "Configurable Input Blocks and Output Blocks and Physical Layout for Analog Neural Memory in Deep Learning Artificial Neural Network," which is incorporated by reference herein.

Optionally, in the embodiments described above, measuring cell current for the purpose of verifying or reading the current can be taking the average or multiple measurements, e.g., 8-32 times, to reduce the impact of noise (such as RTN or any random noise) and/or to detect any outlier bits that are defective and need to be replaced by a redundant bit.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A neuron output circuit comprising:
a first adjustable current source to generate a first scaled current in response to a first neuron current and a first control signal, the first adjustable current source coupled between a voltage source and a node; and
a second adjustable current source to generate a second scaled current in response to a second neuron current and a second control signal, the second adjustable current source coupled between the node and ground;
wherein the node provides an output current equal to the first scaled current minus the second scaled current.

2. A neuron output circuit comprising:
an adjustable capacitor comprising a first terminal coupled to a voltage source and a second terminal providing an output voltage for the neuron output circuit;
a control transistor comprising a first terminal, a second terminal, and a gate receiving a control signal;
a first switch selectively coupled between the first terminal and the second terminal of the adjustable capacitor;
a second switch selectively coupled between the second terminal of the adjustable capacitor and the first terminal of the control transistor; and
an adjustable current source coupled between the second terminal of the control transistor and ground, wherein the adjustable current source generates a scaled current in response to a neuron current and the control signal.

3. A neuron output circuit comprising:
an adjustable capacitor comprising a first terminal coupled to a voltage source and a second terminal providing an output voltage for the neuron output circuit;
a control transistor comprising a first terminal, a second terminal, and a gate receiving a control signal;
a switch selectively coupled between the second terminal of the adjustable capacitor and the first terminal of the control transistor; and
an adjustable current source coupled between the second terminal of the control transistor and ground, wherein the adjustable current source generates a scaled current in response to a neuron current and the control signal.

4. A neuron output circuit comprising:
an adjustable capacitor comprising a first terminal and a second terminal, the first terminal providing an output voltage for the neuron output circuit;
a control transistor comprising a first terminal, a second terminal, and a gate receiving a control signal;
a first switch selectively coupled between the first terminal of the adjustable capacitor and the first terminal of the control transistor; and
an adjustable current source coupled between the second terminal of the control transistor and ground, wherein the adjustable current source generates a scaled current in response to a neuron current and the control signal.

5. A neuron output circuit comprising:
a first operational amplifier comprising an inverting input, a non-inverting input, and an output;
a second operational amplifier comprising an inverting input, a non-inverting input, and an output;
a first adjustable current source coupled between the inverting input of the first operational amplifier and ground to generate a first scaled current in response to a first neuron current and a first control signal;
a second adjustable current source coupled between the inverting input of the second operational amplifier and ground to generate a second scaled current in response to a second neuron current and a second control signal;
a first adjustable resistor coupled between the output of the first operational amplifier and the inverting input of the first operational amplifier;
a second adjustable resistor coupled between the output of the second operational amplifier and the inverting input of the second operational amplifier; and
a third adjustable resistor coupled between the output of the first operational amplifier and the inverting input of the second operational amplifier.

6. A neuron output circuit comprising:
a first operational amplifier comprising an inverting input, a non-inverting input, and an output;
a second operational amplifier comprising an inverting input, a non-inverting input, and an output;
a first adjustable current source coupled between the inverting input of the first operational amplifier and ground to generate a first scaled current in response to a first neuron current and a first control signal;
a second adjustable current source coupled between the inverting input of the second operational amplifier and ground to generate a second scaled current in response to a second neuron current and a second control signal;
a first switch coupled between the inverting input and the output of the first operational amplifier;
a second switch coupled between the inverting input and the output of the second operational amplifier;
a first adjustable capacitor coupled between the inverting input and the output of the first operational amplifier;
a second adjustable capacitor coupled between the inverting input and the output of the second operational amplifier; and
a third adjustable capacitor coupled between the output of the first operational amplifier and the inverting input of the second operational amplifier.

* * * * *